United States Patent
Fukuhara

(10) Patent No.: US 7,586,605 B2
(45) Date of Patent: Sep. 8, 2009

(54) METHOD FOR TESTING A POLARIZATION STATE, METHOD FOR MANUFACTURING A SEMICONDUCTOR DEVICE, AND TEST SUBSTRATE FOR TESTING A POLARIZATION STATE

(75) Inventor: Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 324 days.

(21) Appl. No.: 11/389,207

(22) Filed: Mar. 27, 2006

(65) Prior Publication Data
US 2006/0250615 A1  Nov. 9, 2006

(30) Foreign Application Priority Data
Mar. 28, 2005  (JP) .......................... P2005-092658

(51) Int. Cl.
*G01J 4/00* (2006.01)
(52) U.S. Cl. ..................... 356/364; 356/369; 356/237.2
(58) Field of Classification Search .................. 356/364, 356/369, 367, 237.2–237.6
See application file for complete search history.

(56) References Cited

U.S. PATENT DOCUMENTS

| | | | | |
|---|---|---|---|---|
| 5,907,393 | A | * | 5/1999 | Kawano et al. .......... 356/237.1 |
| 6,020,966 | A | | 2/2000 | Ausschnitt et al. |
| 6,594,012 | B2 | | 7/2003 | Takeuchi et al. |
| 7,369,224 | B2 | * | 5/2008 | Oomori et al. ........... 356/237.2 |
| 2004/0264350 | A1 | | 12/2004 | Ueki et al. |
| 2005/0099613 | A1 | | 5/2005 | Fukuhara |
| 2006/0098183 | A1 | | 5/2006 | Sato et al. |
| 2006/0146231 | A1 | * | 7/2006 | Amako et al. .................. 349/86 |

FOREIGN PATENT DOCUMENTS

| JP | 2004-207709 | 7/2004 |
|---|---|---|
| KR | 10-2005-0001471 | 1/2005 |

OTHER PUBLICATIONS

Notice of Grounds for Rejection issued by the Korean Patent Office on Mar. 26, 2007, for Korean Patent Application No. 10-2006-27336, and English-language translation thereof.
Notification of the First Office Action issued by the Chinese Patent Office on Jul. 18, 2008, for Chinese Patent Application No. 200610084026.4, and English-language translation thereof.

* cited by examiner

*Primary Examiner*—Gregory J Toatley, Jr.
*Assistant Examiner*—Iyabo S Alli
(74) *Attorney, Agent, or Firm*—Finnegan, Henderson, Farabow, Garrett & Dunner, L.L.P.

(57) ABSTRACT

A method for testing a polarization state of polarized light includes forming a test photosensitive film on a test wafer, the test wafer having a flat surface and a grid pattern in which reflectance changes depending on a polarization direction of the polarized light, exposing the test photosensitive film to the polarized light, measuring a change of a property of the test photosensitive film caused by the polarized light, and determining a polarization state of the polarized light, based on the change.

21 Claims, 28 Drawing Sheets

ANGLE BETWEEN GROOVE AND VIBRATION DIRECTION OF ELECTRIC VECTOR

ANGLE OF LONG DIRECTION OF GROOVE

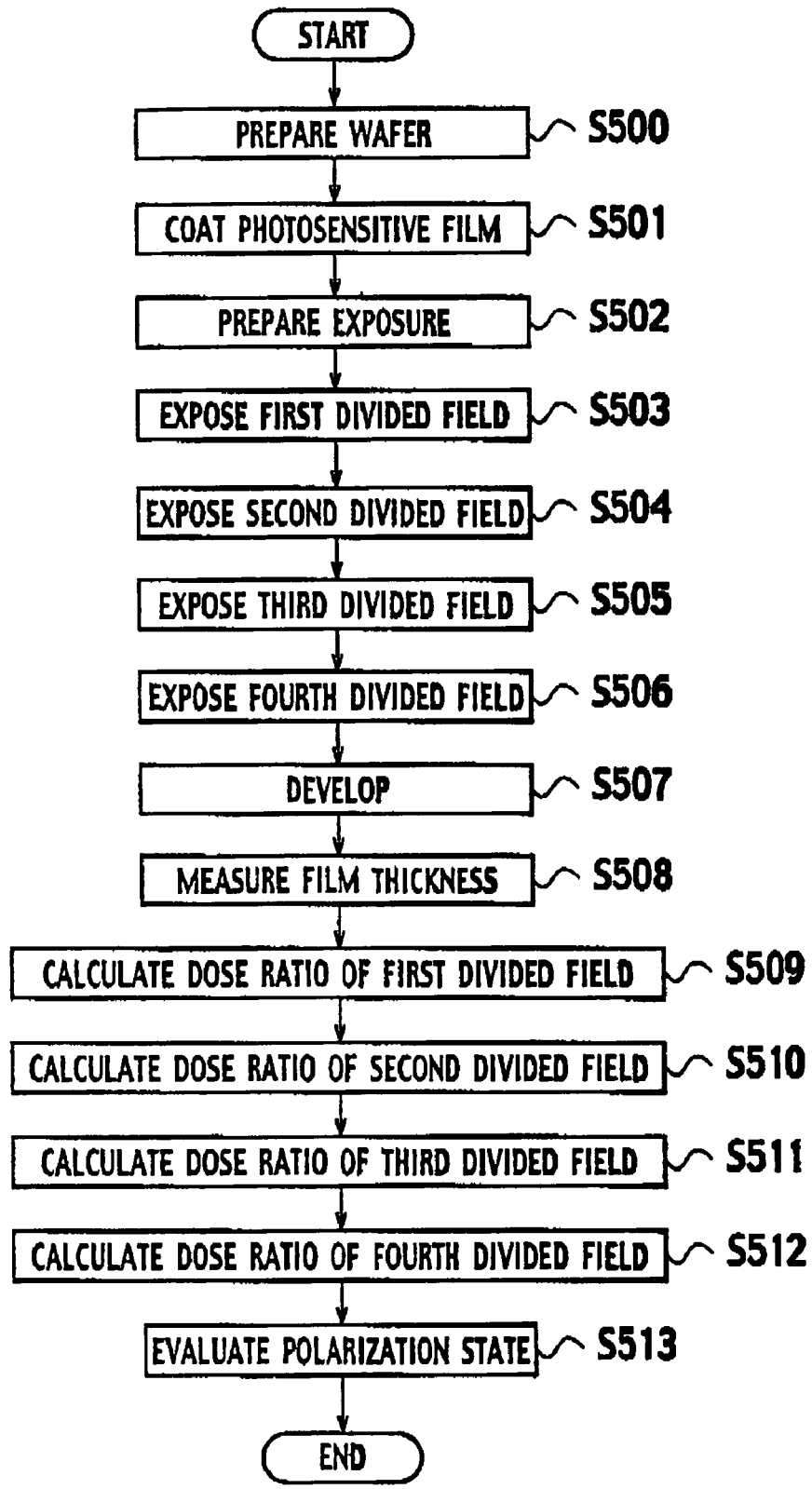

METHOD FOR TESTING A POLARIZATION STATE, METHOD FOR MANUFACTURING A SEMICONDUCTOR DEVICE, AND TEST SUBSTRATE FOR TESTING A POLARIZATION STATE

CROSS REFERENCE TO RELATED APPLICATIONS AND INCORPORATION BY REFERENCE

This application is based upon and claims the benefit of priority from prior Japanese Patent Application P2005-092659 filed on Mar. 28, 2005; the entire contents of which are incorporated by reference herein.

BACKGROUND OF THE INVENTION

1. Field of the Invention

The present invention relates to photolithographic projection and in particular to a method for testing a polarization state, a method for manufacturing a semiconductor device, and a test substrate for testing the polarization state.

2. Description of the Related Art

When a pattern having a size similar to a wavelength of a polarized light or below the wavelength is formed by lithography, a polarization state of the polarized light affects image formation of the pattern. The polarization state includes an "S polarization" perpendicular to a plane of incidence and a "P polarization" parallel to the plane of incidence. When a line and space pattern is formed, the "S polarization" tends to increase contrast and dose margin more than the "P polarization". Therefore, in Japanese Patent Laid-Open Publication No. 2004-207709, a polarized light is used to project a mask pattern onto a wafer. A precise pattern is formed on the wafer by the S polarized light incident on the wafer.

The polarized light makes it possible to increase the dose margin when the precise pattern is formed. However, the size error of the precise pattern, caused by the error of the degree of polarization of the polarized light, has recently become a problem. The degree of polarization is defined by dividing a difference between optical intensities of the S and P polarized lights by a total optical intensity of the polarized light. The degree of polarization ranges from minus one to plus one. The error of the degree of polarization affects the image formation of a precise pattern. As the pattern size is enlarged, the affect of the error of the degree of polarization is reduced. Therefore, the error of the degree of polarization is regarded as one factor of an optical proximity effect (OPE). The OPE causes the size error of the pattern projected by a reduction projection system, depending on the size of the pattern. However, there are a plurality of OPE factors in addition to the error of the degree of polarization. Accordingly, it is difficult to identify a single factor of the size error caused by the OPE. Therefore, it is desired to develop a technique to determine the quantity of the polarization state of the polarized light, independent of other factors, when the OPE is observed.

SUMMARY OF THE INVENTION

An aspect of present invention inheres in a method for testing a polarization state of polarized light according to an embodiment of the present invention. The method includes preparing a test photosensitive film on a test wafer having a flat surface and a grid pattern. A reflectance of the grid pattern changes depending on a polarization direction of the polarized light. The method further includes exposing the test photosensitive film to the polarized light, measuring a change of a property of the test photosensitive film caused by the polarized light, and determining a polarization state of the polarized light, based on the change.

Another aspect of the present invention inheres in a method for manufacturing a semiconductor device according to the embodiment of the present invention. The method includes preparing a test photosensitive film on a test wafer having a flat surface and a grid pattern of which reflectance changes depending on a polarization direction of a polarized light, exposing the test photosensitive film to the polarized light, measuring a change of a property of the test photosensitive film caused by the polarized light, evaluating a polarization state of the polarized light, based on the change, correcting an illumination optical system for the polarized light based on the polarization state, coating a product resist film on a product wafer, projecting a circuit pattern onto the product resist film by using the corrected illumination optical system, and developing the product resist film to form a product resist pattern corresponding to the circuit pattern on the product wafer.

Yet another aspect of the present invention inheres in a test substrate for testing the polarization state of polarized light according to the embodiment of the present invention. The test substrate includes a test wafer having a grid pattern to be exposed to the polarized light. The grid pattern has a pitch less than twice the wavelength of the polarized light. The test substrate further includes a test photosensitive film disposed on the test wafer.

BRIEF DESCRIPTION OF DRAWINGS

FIG. 45 is a flowchart depicting the method for testing the polarization state in accordance with the fifth embodiment of the present invention.

DETAILED DESCRIPTION OF THE INVENTION

Figure 1:
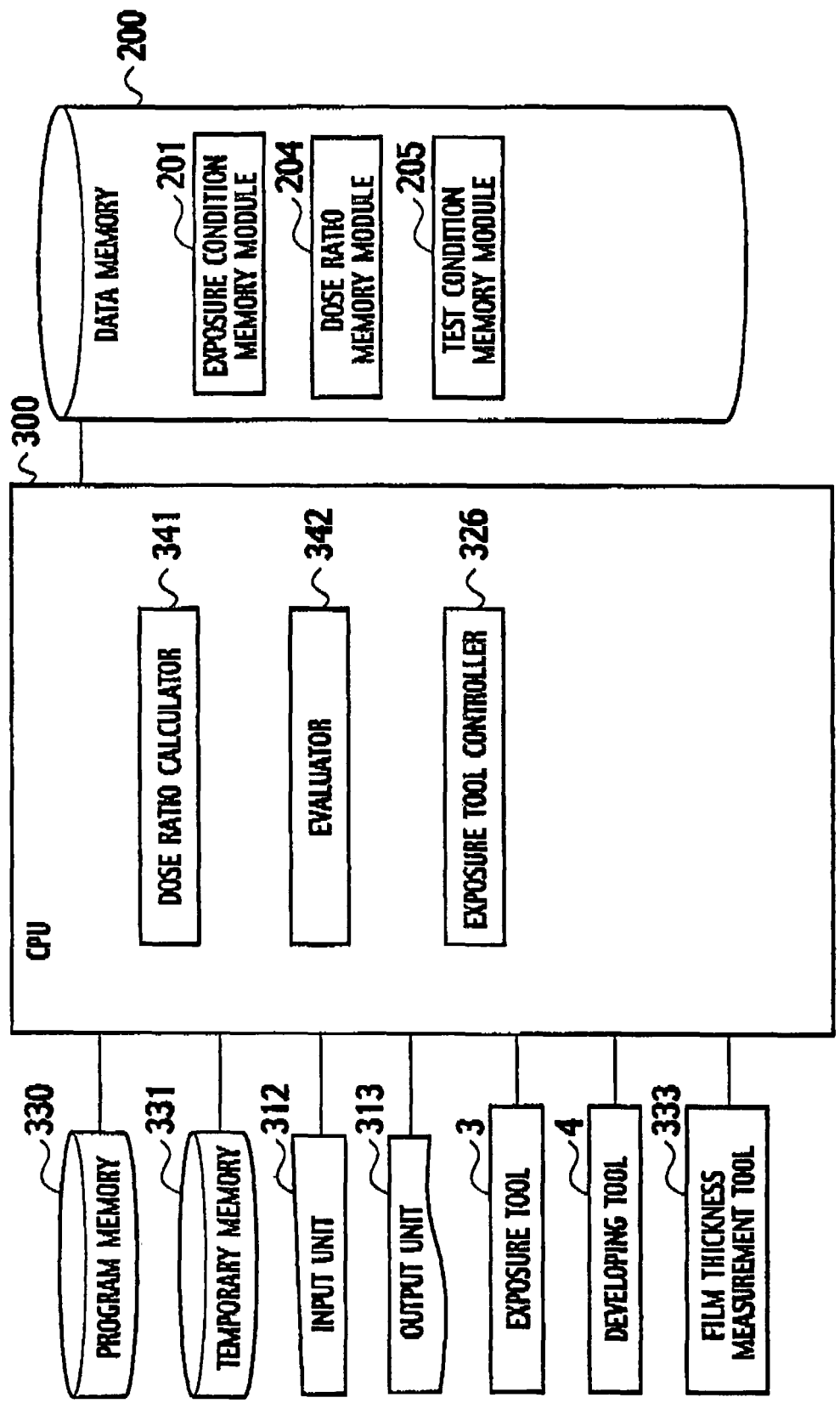
FIG. 1 is a diagram of a system for testing a polarization state in accordance with a first embodiment of the present invention.

Embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIRST EMBODIMENT

With reference to FIG. 1, a system for testing a polarization state in accordance with the first embodiment includes a central processing unit (CPU) 300 and an exposure tool 3 connected to the CPU 300. The exposure tool 3 is configured to expose a test photosensitive film on a test wafer to a polarized light. The test wafer has a flat surface and a two-dimensional grid pattern. A reflectance of the grid pattern changes depending on a polarization direction of the polarized light.

The CPU 300 includes a dose ratio calculator 341 and an evaluator 342. The dose ratio calculator 341 is configured to calculate a dose ratio "$R_E$". The dose ratio "$R_E$" is a ratio of a reference dose "$D_R$" to a standard dose "$D_S$". The standard dose "$D_S$" is a dose of the polarized light that will change a property of the test photosensitive film on the flat surface. The reference dose "$D_R$" is a dose of the polarized light that will change the property of the test photosensitive film on the grid pattern to the same degree as on the flat surface. The evaluator 342 is configured to evaluate a polarization state of the polarized light, based on the dose ratio "$R_E$".

Figure 2:
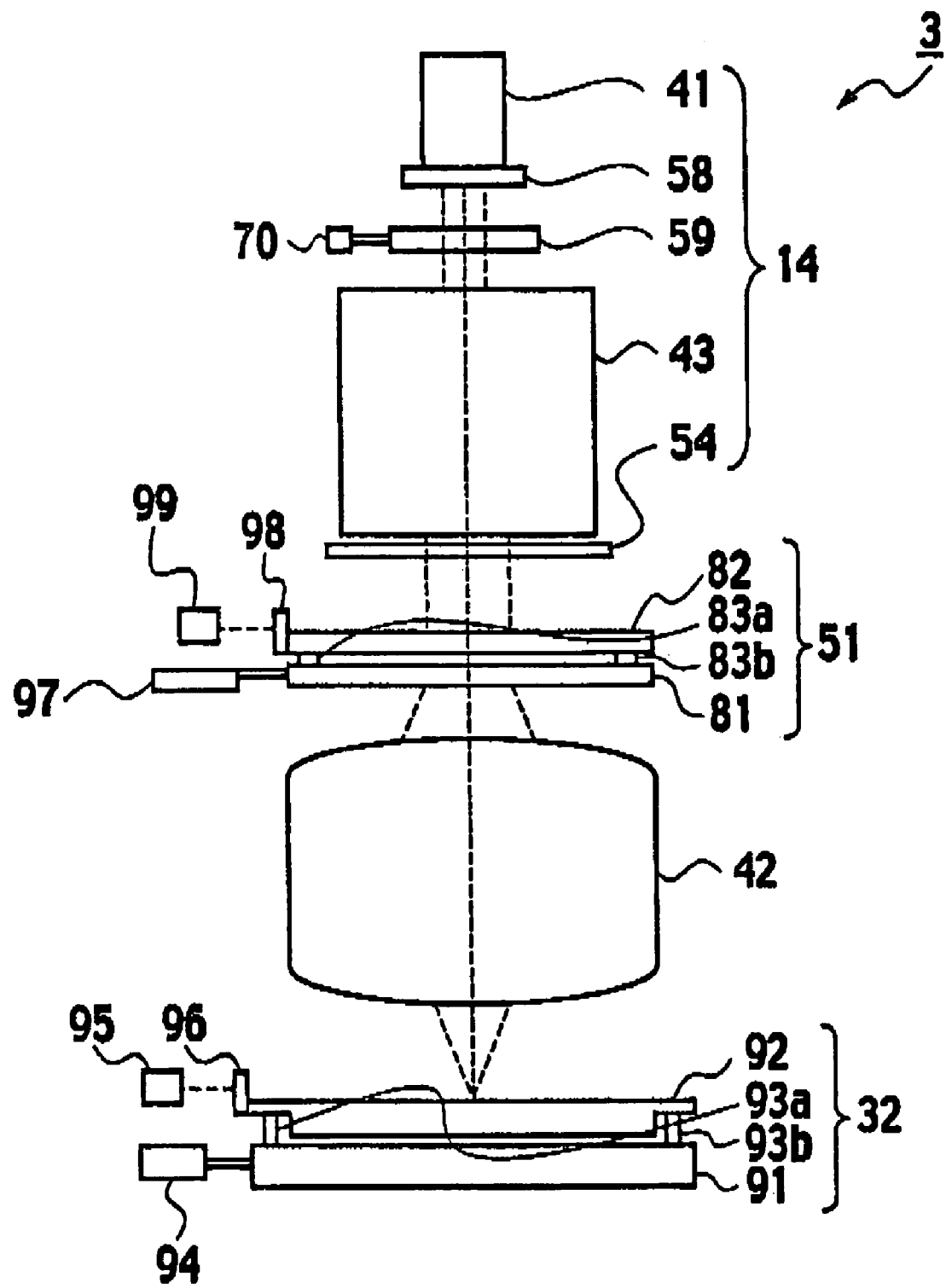
FIG. 2 illustrates an exposure tool in accordance with the first embodiment of the present invention.

With reference to FIG. 2, the exposure tool 3 includes an illumination optical system 14. The illumination optical system 14 includes a light source 41 for emitting a light such as 193 nm argon fluoride (ArF) laser, an aperture diaphragm holder 58 disposed under the light source 41, a polarizer 59 for polarizing the light emitted from the light source 41, an illuminator 43 for condensing the polarized light, and a slit holder 54 disposed under the illuminator 43. The exposure tool 3 further includes a reticle stage 51 disposed beneath the slit holder 54, a projection optical system 42 disposed beneath the reticle stage 25, and a wafer stage 32 disposed beneath the projection optical system 42. A polarizer rotator 70 is connected to the polarizer 59. The polarizer rotator 7 is configured to adjust a position of the polarizer 59 to define the polarization direction of the polarized light.

The reticle stage 51 includes a reticle XY stage 81, shafts 83a, 83b provided on the reticle XY stage 81, and a reticle tilting stage 82 attached to the reticle XY stage 81 through the shafts 83a, 83b. The reticle stage 51 is attached to a reticle stage aligner 97. The reticle stage aligner 97 aligns the position of the reticle XY stage 81. Each of the shafts 83a, 83b extends from the reticle XY stage 81. Therefore, the position of the reticle tilting stage 82 is determined by the reticle XY stage 81. The tilt angle of the reticle tilting stage 82 is determined by the shafts 83a, 83b. Further, a reticle stage mirror 98 is attached to the edge of the reticle tilting stage 82. The position of the reticle tilting stage 82 is monitored by an interferometer 99 disposed opposite the reticle stage mirror 98.

The wafer stage 32 includes a wafer XY stage 91, shafts 93a, 93b provided on the wafer XY stage 91, and a wafer tilting stage 92 attached to the wafer XY stage 91 through the shafts 93a, 93b. The wafer stage 32 is attached to a wafer stage aligner 94. The wafer stage aligner 94 aligns the position of the wafer XY stage 91. Each of the shafts 93a, 93b extends from the wafer XY stage 91. Therefore, the position of the wafer tilting stage 92 is determined by the wafer XY stage 91. The tilt angle of the wafer tilting stage 92 is determined by the shafts 93a, 93b. Further, a wafer stage mirror 96 is attached to the edge of the wafer tilting stage 92. The position of the wafer tilting stage 92 is monitored by an interferometer 95 disposed opposite the wafer stage mirror 96.

Figure 3:
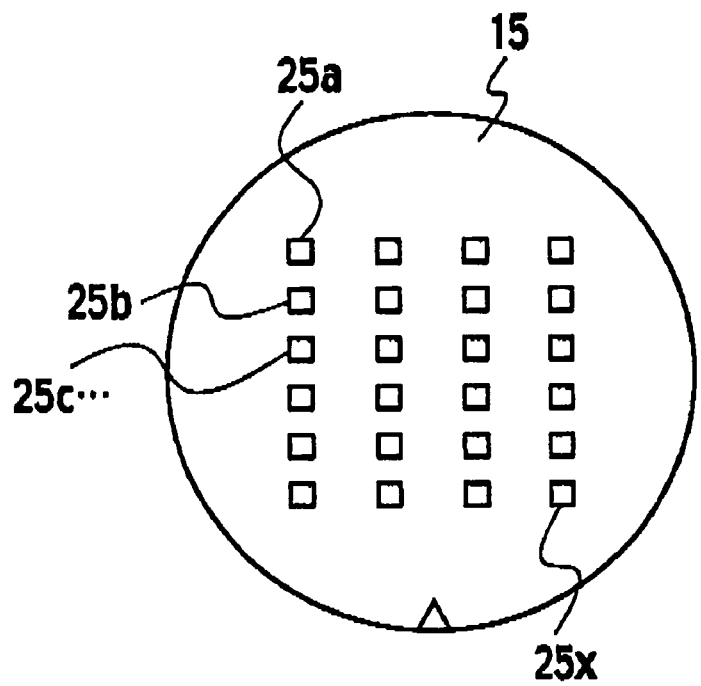
FIG. 3 is a plan view of a test substrate in accordance with the first embodiment of the present invention.
Figure 4:
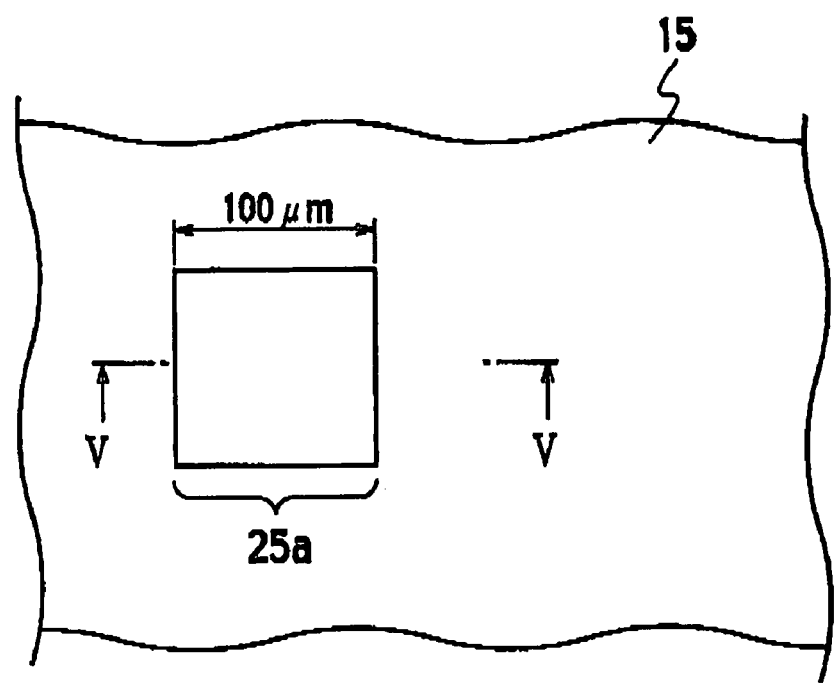
FIG. 4 is a first enlarged plan view of the test substrate in accordance with the first embodiment of the present invention.
Figure 5:
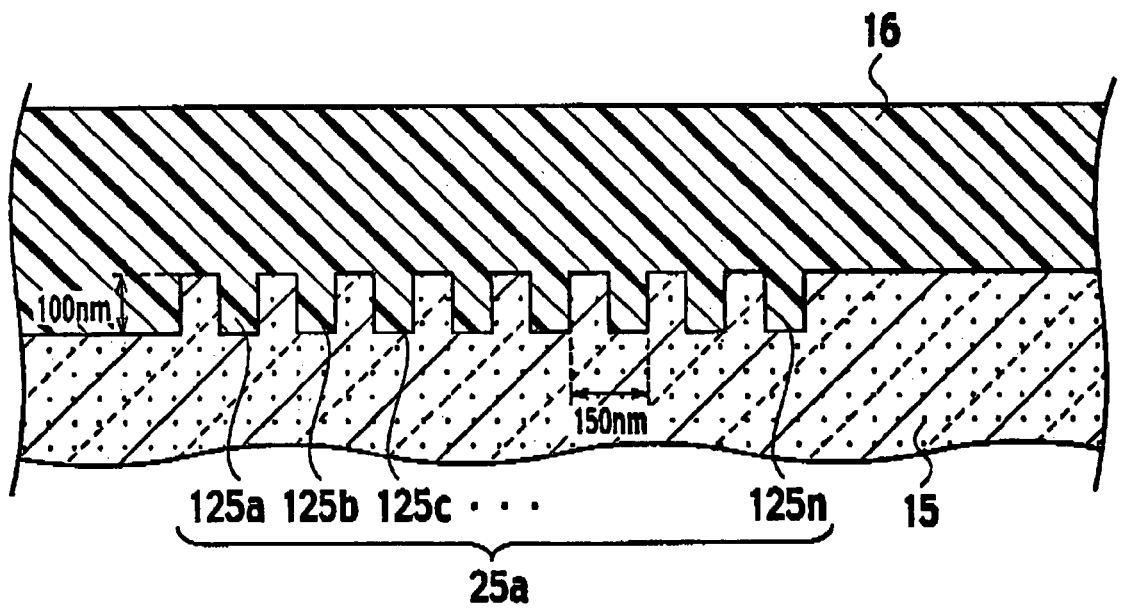
FIG. 5 is a first cross sectional view of the test substrate shown in FIG. 4 cut from a direction of line V-V in accordance with the first embodiment of the present invention.

A test substrate shown in FIG. 3 is disposed on the wafer stage 32 of the exposure tool 3. The test substrate includes the test wafer 15 and the test photosensitive film 16 coated on the test wafer 15 shown in FIG. 5. The test wafer 15 is composed of silicon (Si), for example. In FIG. 3, a plurality of grid patterns 25a, 25b, 25c, -, 25x are delineated on the test wafer 15. FIG. 4 shows an enlarged top view of the grid pattern 25a and FIG. 5 shows a sectional view taken on line V-V in FIG. 4. The shape of the grid pattern 25a is a square with 100 micrometer sides. A plurality of grooves 125a, 125b, 125c, -, 125n are periodically delineated in the grid pattern 25a with a pitch of 150 nm. The depth of each of the grooves 125a-125n is 100 nanometers. It should be noted that the pitch of the grid pattern 25a is less than twice the wavelength of the polarized light. Or, the pitch of the grid pattern 25a is less than the wavelength of the polarized light. The grid patterns 25a-25x are arranged in a matrix on the flat surface of the test wafer 15. The grid patterns 25a-25x are spaced more than 100 micrometers apart.

The test photosensitive film 16 coated on the test wafer 15 is composed of a positive photoresist, for example. Each of the plurality of grooves 125a-125n is filled with the test photosensitive film 16. Therefore, different materials are periodically arranged in the grid pattern 25a, having a pitch less than twice the wavelength of the polarized light. Here, the "different materials" have different optical properties, such as refractive index and extinction coefficient. Other grid patterns 25b-25x are similar to the grid pattern 25a.

Figure 6:
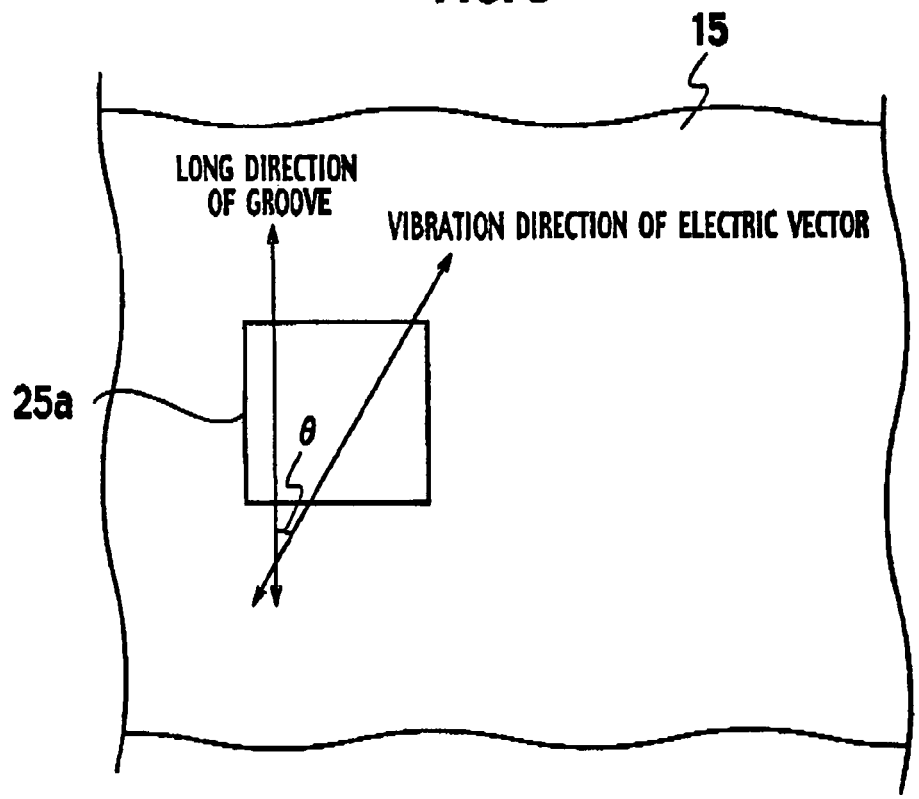
FIG. 6 is a second enlarged plan view of the test substrate in accordance with the first embodiment of the present invention.

When the grid pattern 25a, shown in FIG. 6, is exposed to the polarized light, the reflectance of the polarized light changes depending on an angle θ between each lengthwise direction of the grooves 125a-125n and a vibration direction of an electric vector of the polarized light. Specifically, in the case where the angle θ is zero degrees, the reflectance is highest. In the case where the angle θ changes to 90 degrees, the reflectance decreases. The shape of the grid pattern 25a, shown in FIG. 4, is not limited to a square with 100 micrometer sides. The grid pattern 25a may have a size sufficient to neglect diffraction of the polarized light at a boundary between the grid pattern 25a and the flat surface of the test wafer 15. For example, one side of the grid pattern 25a is more than a tenth of the wavelength of the polarized light. If the wavelength is 193 nm, the side of the grid pattern 25a is more than 2 micrometers.

With reference again to FIG. 1, a developing tool 4 and a film thickness measurement tool 333 are further connected to the CPU 300. The developing tool 4 is configured to develop the test photosensitive film 16 exposed to the polarized light in the exposure tool 3. Developing conditions such as developer concentration, developer temperature, and developing time can be adjusted in the developing tool 4. A spectrophotometer, an ellipsometer, an optical microscope, and an atomic force microscope (AFM) can be used as the film thickness measurement tool 333. The film thickness measurement tool 333 is configured to measure a film thickness of the developed test photosensitive film 16 as a change of the property of the test photosensitive film 16 caused by the polarized light. When the spectrophotometer or the ellipsometer is used for the film thickness measurement tool 333, an appropriate wavelength of a test light by the film thickness measurement tool 333 is selected to avoid an error caused by the grid pattern 25a shown in FIG. 5.

The CPU 300, shown in FIG. 1, further includes an exposure tool controller 326. The exposure tool controller 326 controls the exposure conditions of the step and scan exposure tool 3. For example, the exposure tool controller 326 adjusts the dose of the polarized light emitted from the light source 41, shown in FIG. 2. Further, the exposure tool controller 326 controls the reticle stage aligner 97 and the wafer stage aligner 94 to shift and tilt the reticle stage 51 and the wafer stage 32. The exposure tool controller 326 also monitors the orientation, the shift direction, and the shift speed of the reticle stage 51 and the wafer stage 32 by using the interferometer 99 and the interferometer 95. The exposure tool controller 326 includes an internal counter to count the number of exposures by the exposure tool 3.

Figure 7:
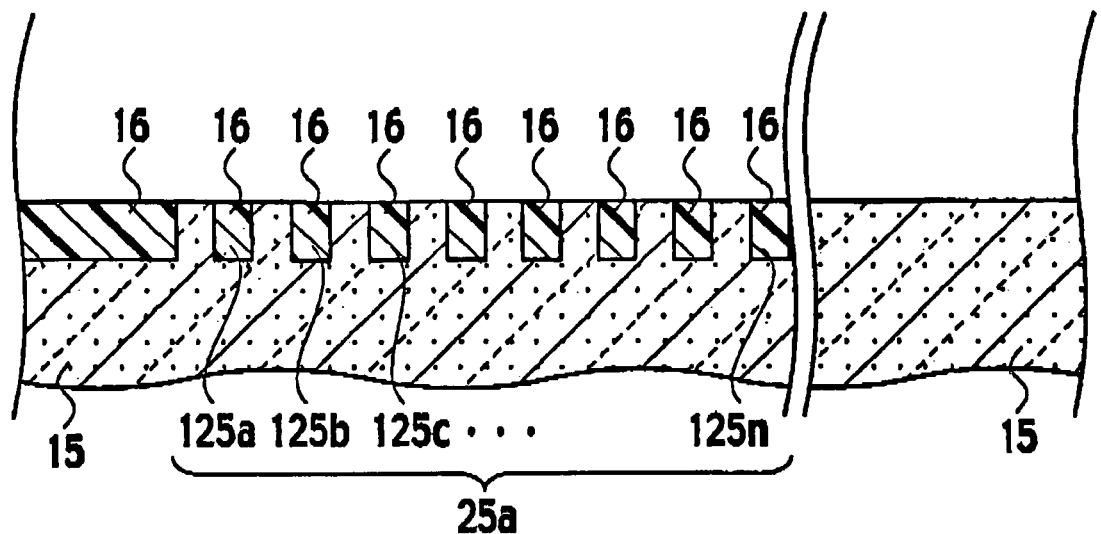
FIG. 7 is a second cross sectional view of the test substrate shown in FIG. 4 cut from the direction of the line V-V in accordance with the first embodiment of the present invention.
Figure 8:
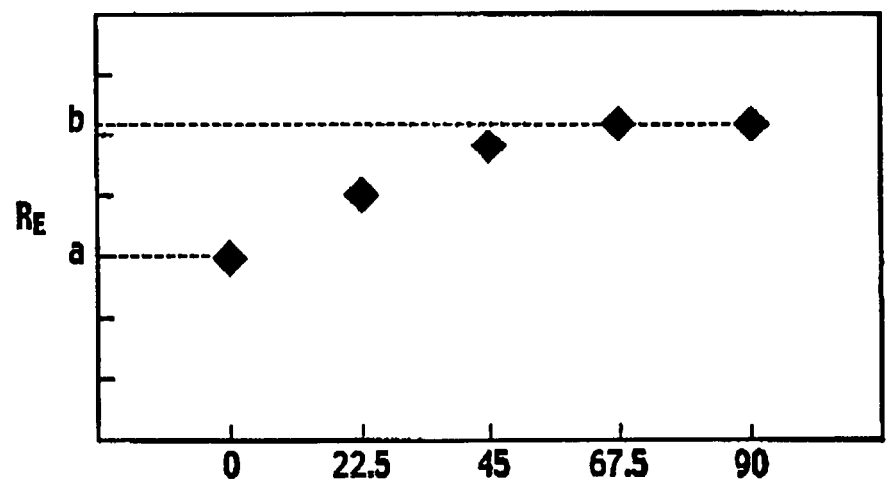
FIG. 8 is a graph of a dose ratio versus an angle between a groove of a grid pattern and a vibration direction of an electric vector of a light in accordance with the first embodiment of the present invention.

The dose ratio calculator 341, shown in FIG. 1, calculates the dose ratio "$R_E$". Here, the standard dose "$D_S$" is the denominator of the dose ratio "$R_E$". The reference dose "$D_R$" is the numerator of the dose ratio "$R_E$". With reference to FIG. 7, the standard dose "$D_S$" is a dose to remove the test photosensitive film 16 from the flat surface of the test wafer 15 after developing. The reference dose "$D_R$" is a dose to remove the test photosensitive film 16 from one of the plurality of grid patterns 25a-25x after developing. FIG. 8 shows the dose ratio "$R_E$" versus the angle θ between each lengthwise direction of the plurality of grooves 125a-125n and the vibration direction of an electric vector of the polarized light, shown in FIG. 6. When the angle θ is 0 degrees, each lengthwise direction of the plurality of grooves 125a-125n and the vibration direction of the electric vector of the polarized light are parallel. In this case, the dose ratio "$R_E$" is the minimum value "a". As the angle θ increases, the dose ratio "$R_E$" increases. When the angle θ is 90 degrees, the dose ratio "$R_E$" is the maximum value "b". The evaluator 342 shown in FIG. 1 evaluates the polarization state of the polarized light based on the dose ratio "$R_E$", calculated by the dose ratio calculator 341, by using the relationship shown in FIG. 8. For example, when the light is not completely polarized and contains an "S" polarized component and a "P" polarized component, the degree of polarization of the polarized light is less than one.

In the case where the test substrate is disposed on the wafer stage 32 so that each lengthwise direction of the plurality of grooves 125a-125n is parallel to the vibration direction of the electric vector of the "S" polarized light, each reflectance of the plurality of grid patterns 25a-25x decreases as the degree of polarization decreases from one. Therefore, the reference dose "$D_R$" to remove the test photosensitive film 16 from one of the plurality of grid patterns 25a-25x increases. Consequently, the dose ratio "$R_E$" increases. Accordingly, when the dose ratio "$R_E$" increases, the evaluator 342, shown in FIG. 1, determines that the degree of polarization of the polarized light decreases.

In the case where the test substrate is disposed on the wafer stage 32 so that each lengthwise direction of the plurality of grooves 125a-125n is perpendicular to the vibration direction of the electric vector of the "S" polarized light, each reflectance of the plurality of grid patterns 25a-25x increases as the degree of polarization decreases from one. Therefore, the reference dose "$D_R$" to remove the test photosensitive film 16 from one of the plurality of grid patterns 25a-25x decreases. Consequently, the dose ratio "$R_E$" decreases. Accordingly, when the dose ratio "$R_E$" decreases, the evaluator 342 shown in FIG. 1 determines that the degree of polarization of the polarized light increases.

Figure 9:
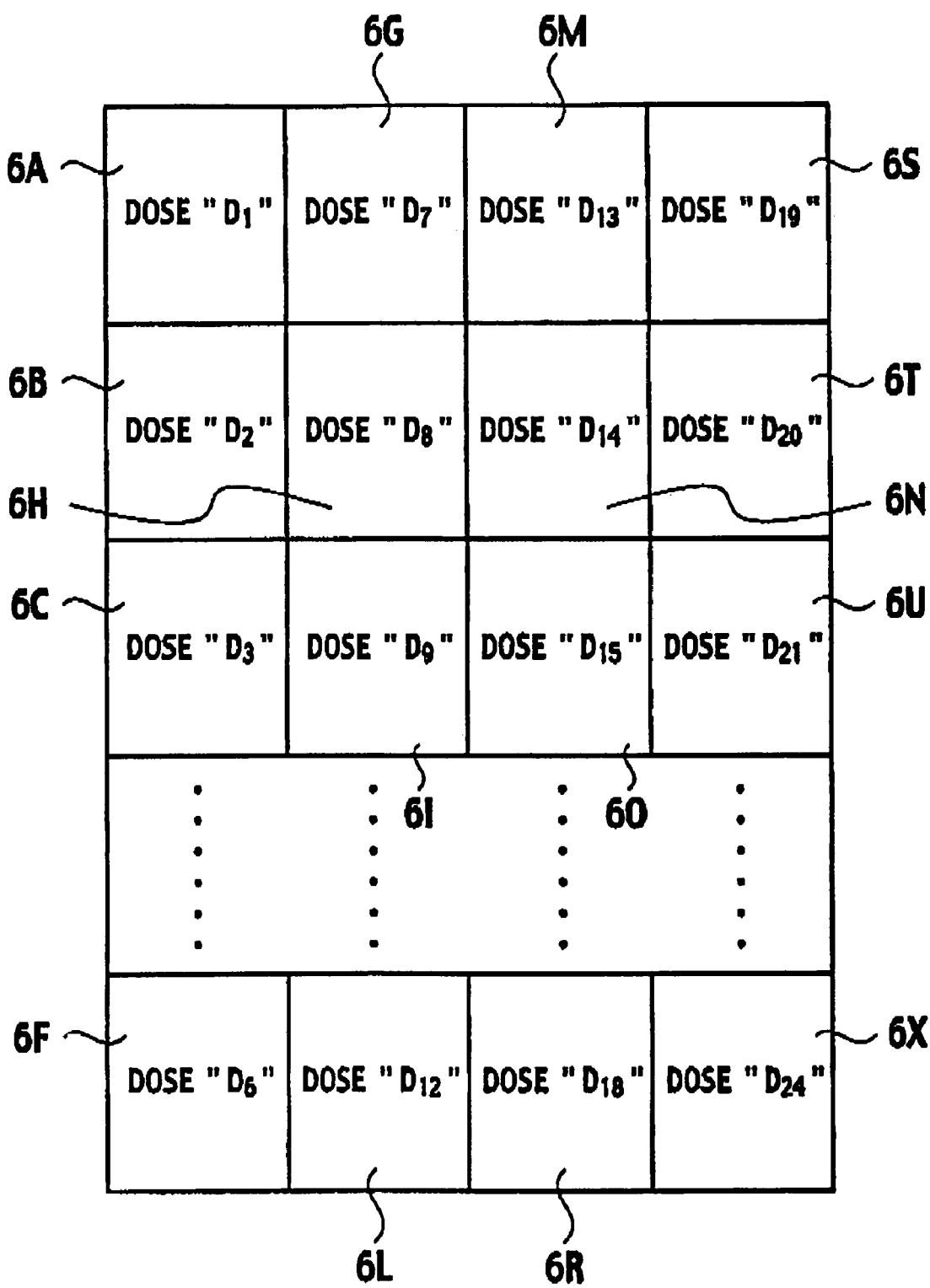
FIG. 9 illustrates exposure conditions of the exposure tool in accordance with the first embodiment of the present invention.

A data memory 200 is further connected to the CPU 300. The data memory 200 includes an exposure condition memory module 201, a dose ratio memory module 204, and a test condition memory module 205. The exposure condition memory module 201 is configured to store a database of the exposure conditions of the exposure tool 3. FIG. 9 shows an example of the database of the exposure conditions. The database stores a plurality of exposure conditions 6A, 6B, 6C, -, 6F, 6G, 6H, 6I, -, 6L, 6M, 6N, 6O, -, 6R, 6S, 6T, 6U, -, 6X defining the doses "$D_1$", "$D_2$", "$D_3$", -, "$D_{24}$", respectively, for step and scan processes by the exposure tool 3 shown in FIG. 2. For example, the doses "$D_1$", "$D_2$", "$D_3$", -, "$D_{24}$" increase step by step. Further, the exposure condition memory module 201, shown in FIG. 1, stores other exposure conditions, such as the numerical aperture (NA) of the projection optical system 42, shown in FIG. 2, a coherence factor "σ", and an aperture type for annular or quadrupolar illumination, for example.

The dose ratio memory module 204 is configured to store the dose ratio "$R_E$" calculated by the dose ratio calculator 341. The test condition memory module 205 is configured to store the maximum number of times of a test to evaluate the polarization state of the polarized light. The test condition memory module 205 is also configured to store a tolerance of a dispersion of the dose ratio "$R_E$".

An input unit 312, an output unit 313, a program memory 330, and a temporary memory 331 are further connected to the CPU 300. A keyboard and/or a mouse may be used for the input unit 312. A printer and/or display devices, such as a liquid crystal display (LCD) and a cathode ray tube (CRT) display, can be used for the output unit 313, for example. The program memory 330 stores an operating program instructing the CPU 300 to transfer data with apparatuses connected to the CPU 300. The temporary memory 331 stores temporary data calculated during operation of the CPU 300. Computer readable mediums, such as semiconductor memories, magnetic memories, optical discs, and magneto optical discs, can be used for the program memory 330 and the temporary memory 331, for example.

Figure 10:
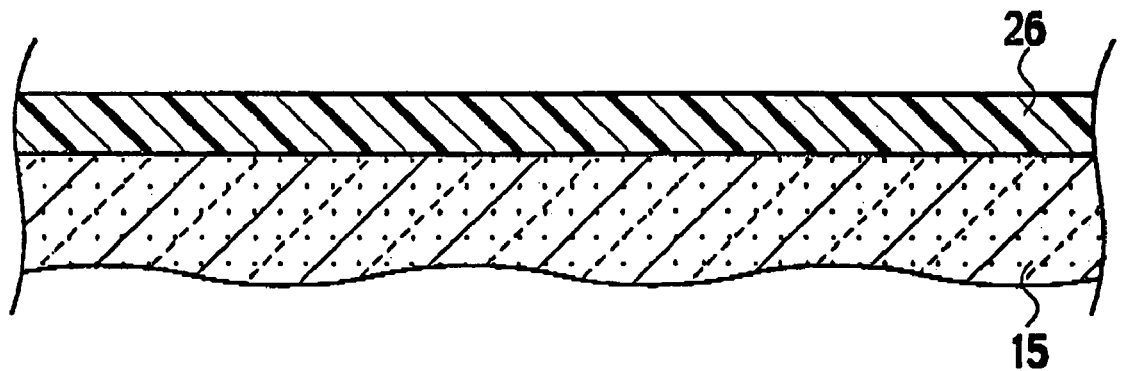
FIG. 10 is a first sectional view of the test substrate depicting a manufacturing process in accordance with the first embodiment of the present invention.
Figure 11:
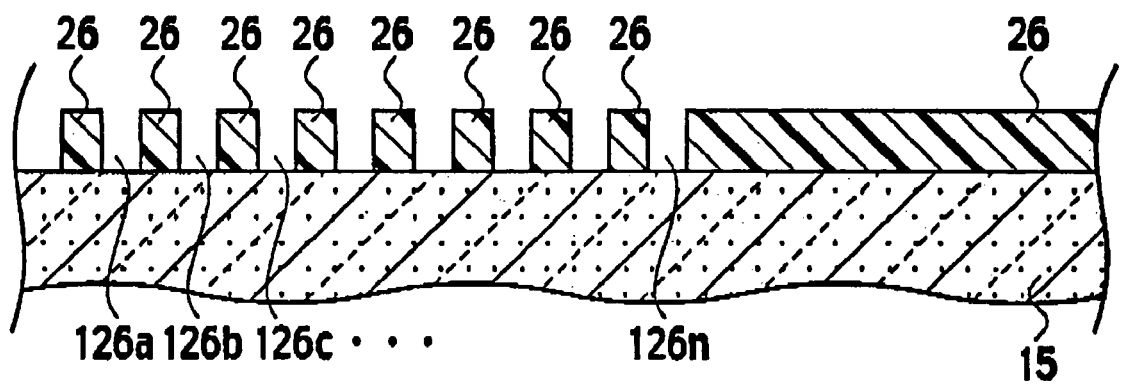
FIG. 11 is a second sectional view of the test substrate depicting the manufacturing process in accordance with the first embodiment of the present invention.
Figure 12:
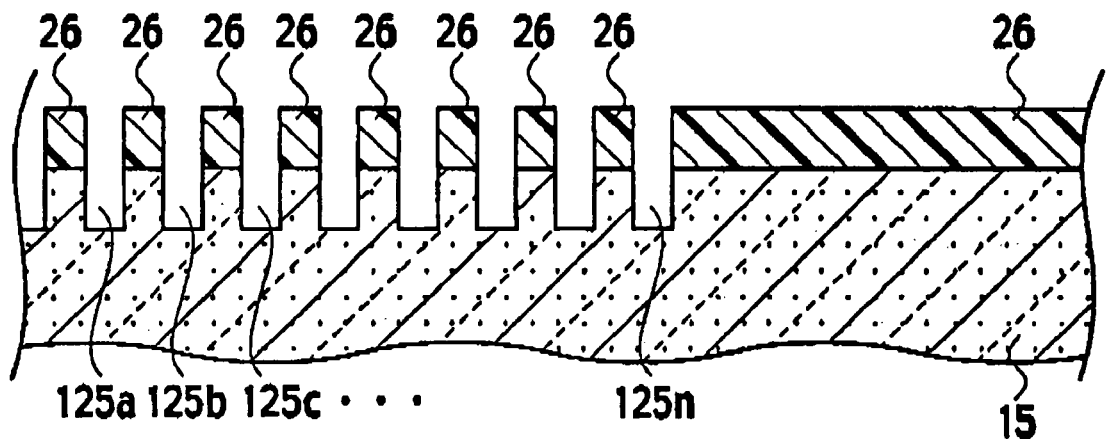
FIG. 12 is a third sectional view of the test substrate depicting the manufacturing process in accordance with the first embodiment of the present invention.

With reference to FIGS. 10-12, a method for manufacturing the test substrate shown in FIG. 5 is described.

In FIG. 10, a resist film 26 is coated on the test wafer 15 by using a spin coater, for example. In FIG. 11, a plurality of openings 126a, 126b, 126c, -, 126n are delineated in the resist film 26 by lithography to expose a plurality of portions of the test wafer 15. In FIG. 12, the plurality of portions of the test wafer 15 exposed from the plurality of openings 126a-126n are selectively removed by etching to form the plurality of grooves 125a-125n in the test wafer 15. After the resist film 26 is removed from the test wafer 15 by an alkaline solution, the test photosensitive film 16 is coated on the test wafer to obtain the test substrate shown in FIG. 5.

Figure 13:
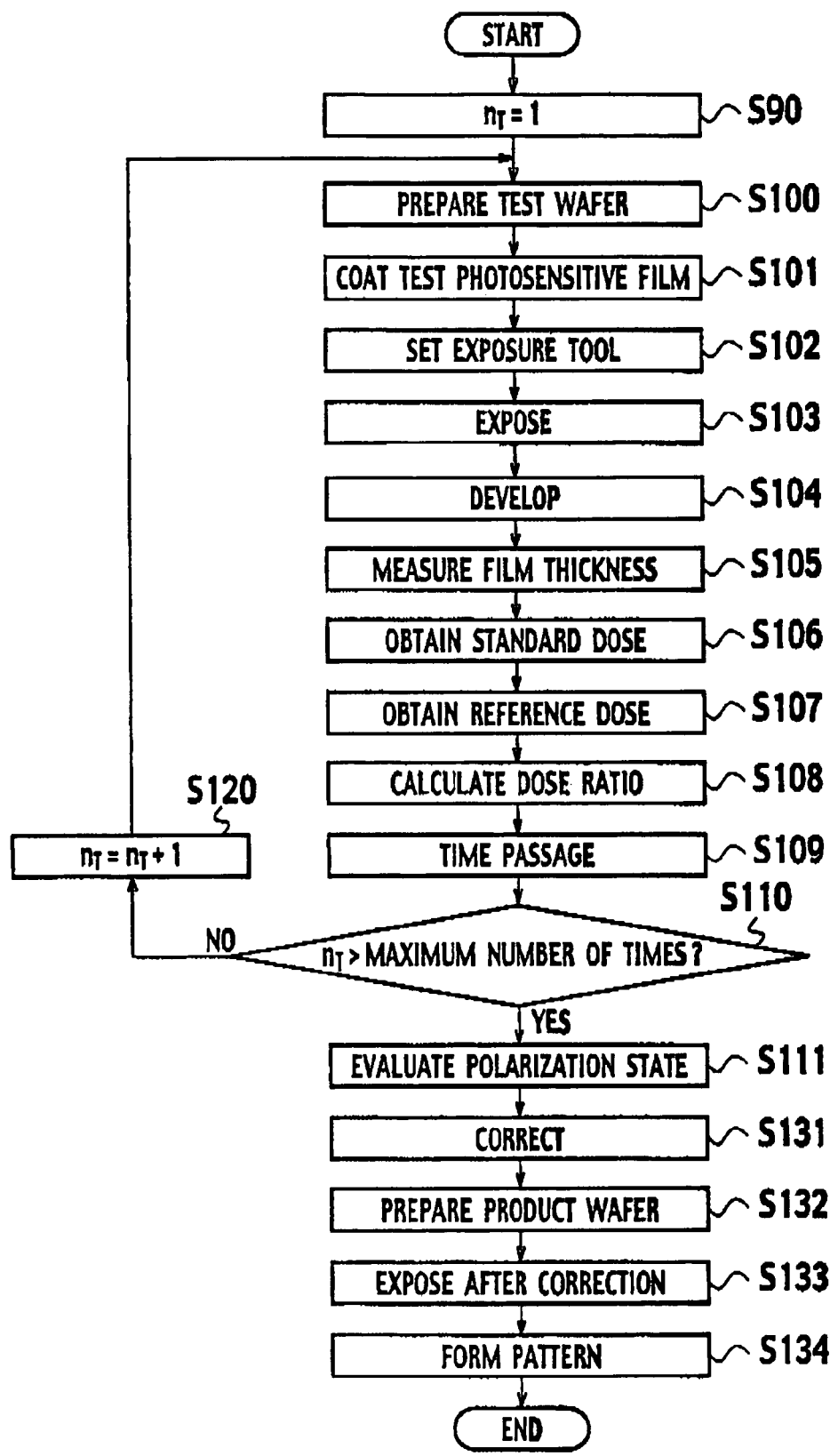
FIG. 13 is a flowchart depicting a method for testing the polarization state in accordance with the first embodiment of the present invention.

With reference next to FIG. 13, a method for manufacturing a semiconductor device using a method for testing the polarization state according to the first embodiment is described.

In step S90, the exposure tool controller 326 shown in FIG. 1 assigns "one" to the internal counter "$n_T$". In step S100, the test wafer 15, shown in FIGS. 3-5, on which the plurality of grid patterns 25a-25x are delineated is prepared. In step S101, the positive photoresist is coated on the test wafer 15 by the spin coater to form the test photosensitive film 16. In step S102, the test wafer 15 is disposed on the wafer stage 32, shown in FIG. 2. Also, a transparent mask substrate composed of quartz glass ($SiO_2$) is disposed on the reticle stage 51. No patterns are delineated on the transparent mask substrate. In other words, nothing is disposed on the reticle stage 51. Then, the exposure tool controller 326, shown in FIG. 1, transmits an instruction to the polarizer rotator 70, shown in FIG. 2, to adjust the position of the polarizer 59. The polarizer rotator 70 adjusts the polarizer 59 to define the polarization direction of the polarized light.

In step S103, the exposure tool controller 326, shown in FIG. 1, fetches the plurality of exposure conditions 6A-6X shown in FIG. 9 from the exposure condition memory module 201. The exposure tool controller 326 instructs the exposure tool 3 shown in FIG. 2 to expose the test photosensitive film 16 on the grid patterns 25a-25x, shown in FIGS. 3-5, and the flat surface to the polarized light by using the plurality of exposure conditions 6A-6X. When the exposure tool 3 exposes the test photosensitive film 16 to the polarized light by the step and scan process, the exposure tool 3 increases the dose step by step as shown in the plurality of exposure conditions 6A-6X, shown in FIG. 9.

In step S104, a post exposure bake (PEB) is performed for the test photosensitive film 16. Thereafter, the test photosensitive film 16 is developed by the developing tool 4. In step S105, the film thickness measurement tool 333 measures the film thicknesses of the portions of the test photosensitive film 16 on the grid patterns 25a-25x, shown in FIGS. 3-5. Also, the film thickness measurement tool 333 measures the film thickness of the portion of the test photosensitive film 16 on the flat surface of the test wafer 15. The film thickness measurement tool 333, shown in FIG. 1, transfers the measured film thicknesses of the test photosensitive film 16 to the dose ration calculator 341.

In step S106, the dose ratio calculator 341 extracts the standard dose "$D_S$" from the plurality of exposure conditions 6A-6X, shown in FIG. 9. The standard dose "$D_S$" is a dose that can remove the test photosensitive film 16 on the flat surface of the test wafer 15, as shown in FIG. 7. In step S107, the dose ratio calculator 341, shown in FIG. 1, extracts the reference dose "$D_R$" from the plurality of exposure conditions 6A-6X shown in FIG. 9. The reference dose "$D_R$" is a dose that can remove the test photosensitive film 16 on one of the plurality of grid patterns 25a-25x, as shown in FIG. 7. In step S108, the dose ratio calculator 341, shown in FIG. 1, calculates the dose ratio "$R_E$" by dividing the reference dose "$D_R$" by the standard dose "$D_S$". The dose ratio calculator 341 reads the internal counter "$n_T$" stored in the exposure tool controller 326. Then, the dose ratio calculator 341 stores the calculated dose ratio "$R_E$" at the "$n_T$"-th time in the dose ratio memory module 204.

In step S109, the exposure tool 3 is operated or left for a certain period. In step S110, the exposure tool controller 326 determines whether a value assigned to the internal counter "$n_T$" is larger than the maximum number of times of the test stored in the test condition memory module 205. When the internal counter number "$n_T$" is smaller than the maximum number of times of the test, step S120 is the next procedure. In step S120, the exposure tool controller 326 ads one to the internal counter "$n_T$" When the internal counter number "$n_T$" is larger than the maximum number of times of the test in step S110, step S111 is the next procedure. In step S111, the dose ratios "$R_E$" at the first to "$n_T$"-th times are stored in the dose ratio memory module 204.

In step S111, the evaluator 342 fetches the dose ratios "$R_E$" at the first to "$n_T$"-th times from the dose ratio memory module 204. The evaluator 342 determines whether the dose ratio "$R_E$" at the latest "$n_T$"-th time is larger than the dose ratio "$R_E$" at the first time. For example, the degree of polarization of the polarized light is set to one when the dose ratio "$R_E$" at the first time is obtained. However, the degree of polarization is decreased by a temporal change in step S109. After step S109, the completely polarized light is changed to partially polarized light. Therefore, the dose ratio "$R_E$" at the latest "$n_T$"-th time is larger than the dose ratio "$R_E$" at the first time. Accordingly, the evaluator 342 determines that the polarization state of the polarized light is to be adjusted when the difference between the dose ratio "$R_E$" at the latest "$n_T$"-th time and the dose ratio "$R_E$" at the first time is larger than the tolerance stored in the test condition memory module 205.

In step S131, the illumination optical system 14, shown in FIG. 2, is adjusted to set the degree of polarization of the polarized light to one. In step S132, a product wafer coated with a product resist film is prepared. The Si wafer can be used as the product wafer, for example. The product resist film is composed of the photoresist, for example. In step S133, the product wafer is disposed on the wafer stage 32. Also, a product mask is disposed on the reticle stage 51. The product mask includes a transparent mask substrate and a product light shield film disposed on the mask substrate. The product light shield film is composed of chrome (Cr), for example. A circuit pattern is delineated in the product light shield film. The product mask is exposed to the polarized light and the image of the circuit pattern is projected onto the product resist film coated on the product wafer. In step S134, the product resist film is developed to form a product resist pattern corresponding to the circuit pattern on the product wafer. Thereafter, a plurality of ions are implanted into the product wafer. Then, an insulator and a circuit are formed on the product wafer, to provide the semiconductor device.

As described above, the system for testing the polarization, state shown in FIG. 1, and the method for testing the polarization state, shown in FIG. 13, make it possible to monitor the temporal change of the polarization state of the polarized light passing through the polarizer 59 in the exposure tool 3, shown in FIG. 2. In an earlier method for testing the polarization state, a polarization analyzer is inserted into the illumination optical system 14 or the projection optical system 42 to test the polarization state of the polarized light. However, the illumination optical system 14 and the projection optical system 42 are precisely aligned. Therefore, specialized experience is required to insert the polarization analyzer into the illumination optical system 14 or the projection optical system 42. However, the method for testing the polarization state according to the first embodiment makes it possible to monitor the temporal change of the polarization state of the polarized light by putting the test substrate, having the test wafer 15 and the plurality of grid patterns 25a-25x, on the wafer stage 32 without inserting the polarization analyzer into the optical system. It is possible to make the shape of the test wafer 15 the same as the shape of the product wafer used for manufacturing the semiconductor device. Therefore, the method for testing the polarization state according to the first embodiment does not require the specialized experience of the prior method. Further, until the evaluator 342 determines if the polarization state of the polarized light deteriorates, there is no need to adjust the optical systems in the exposure tool 3 with the polarization analyzer to correct the polarization state. Therefore, the method for testing the polarization state according to the first embodiment simplifies the maintenance of the exposure tool 3. Also, the method for testing the polarization state according to the first embodiment decreases analysis time.

In steps S105-S107 of FIG. 13, observing the surface of the test wafer 15, shown in FIG. 7, with the eye or an optical microscope is an alternative. In this case, the standard dose "$D_S$" and the reference dose "$D_R$" may be transferred to the dose ratio calculator 341 from the input unit 312.

Figure 14:
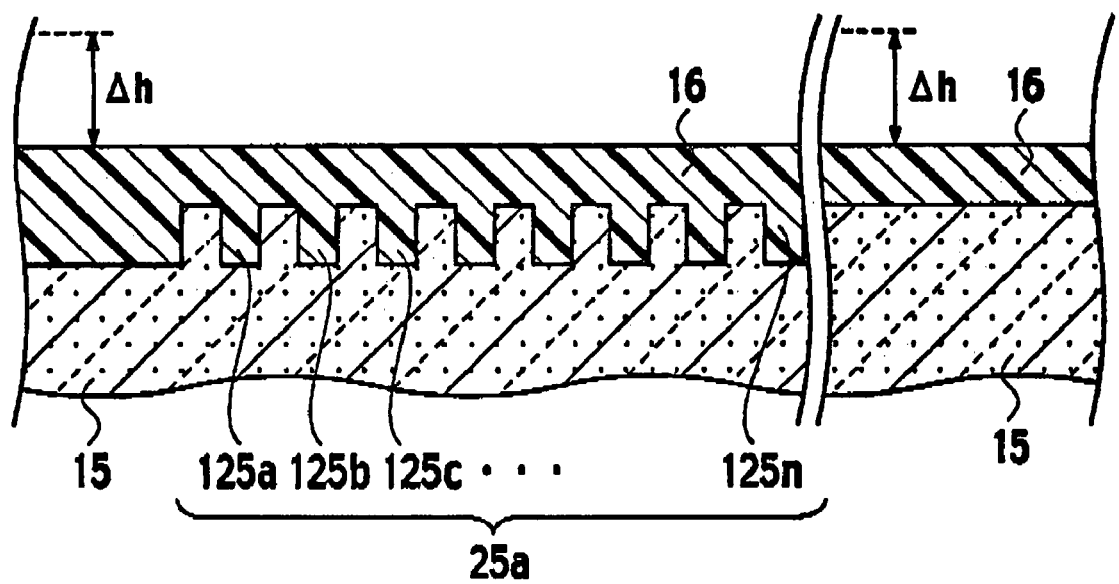
FIG. 14 is a third cross sectional view of the test substrate shown in FIG. 4 cut from the direction of the line V-V in accordance with the first embodiment of the present invention.

Defining a dose to decrease a thickness $\Delta h$ of the test photosensitive film 16 on the flat surface, shown in FIG. 14, from an original thickness, as the standard dose "$D_S$", is also an alternative. In this case, a dose to decrease the thickness $\Delta h$ of the test photosensitive film 16 on one of the plurality of grid patterns 25a-25x, from the original thickness, is defined as the reference dose "$D_R$".

SECOND EMBODIMENT

Figure 15:
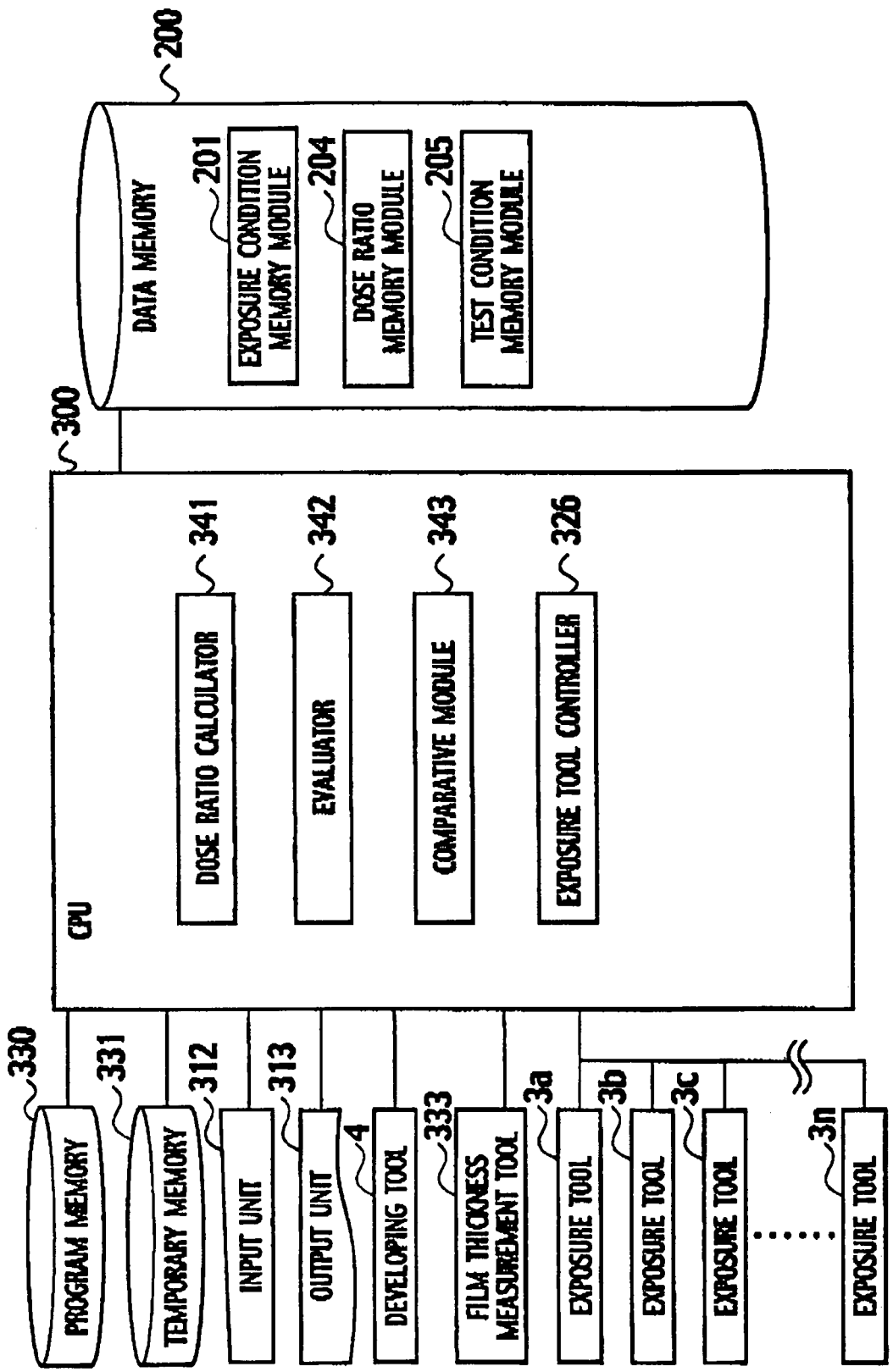
FIG. 15 is a diagram of the system for testing the polarization state in accordance with a second embodiment of the present invention.

With reference to FIG. 15, the system for testing the polarization state according to the second embodiment includes a plurality of exposure tools 3a, 3b, 3c, -, 3n connected to the CPU 300. Each of the exposure tools 3a-3n includes a plurality of components similar to the exposure tool 3, shown in FIG. 2. The CPU 300 further includes a comparative module 343. The comparative module 343 is configured to compare the dose ratios "$R_E$" of the plurality of exposure tools 3a-3n to determine whether the polarization states of the polarized lights in the plurality of exposure tools 3a-3n are the same or not. In the case where the polarization states of the polarized lights in the. plurality of exposure tools 3a-3n are different from each other, the comparative module 343 ranks the plurality of exposure tools 3a-3n hierarchically, based on the dose ratios "$R_E$". The test condition memory module 205 stores the tolerance of the dispersion of the dose ratios "$R_E$" of the plurality of exposure tools 3a-3n. Other components in the system for testing the polarization state, shown in FIG. 15, are similar to FIG. 1.

Figure 16:
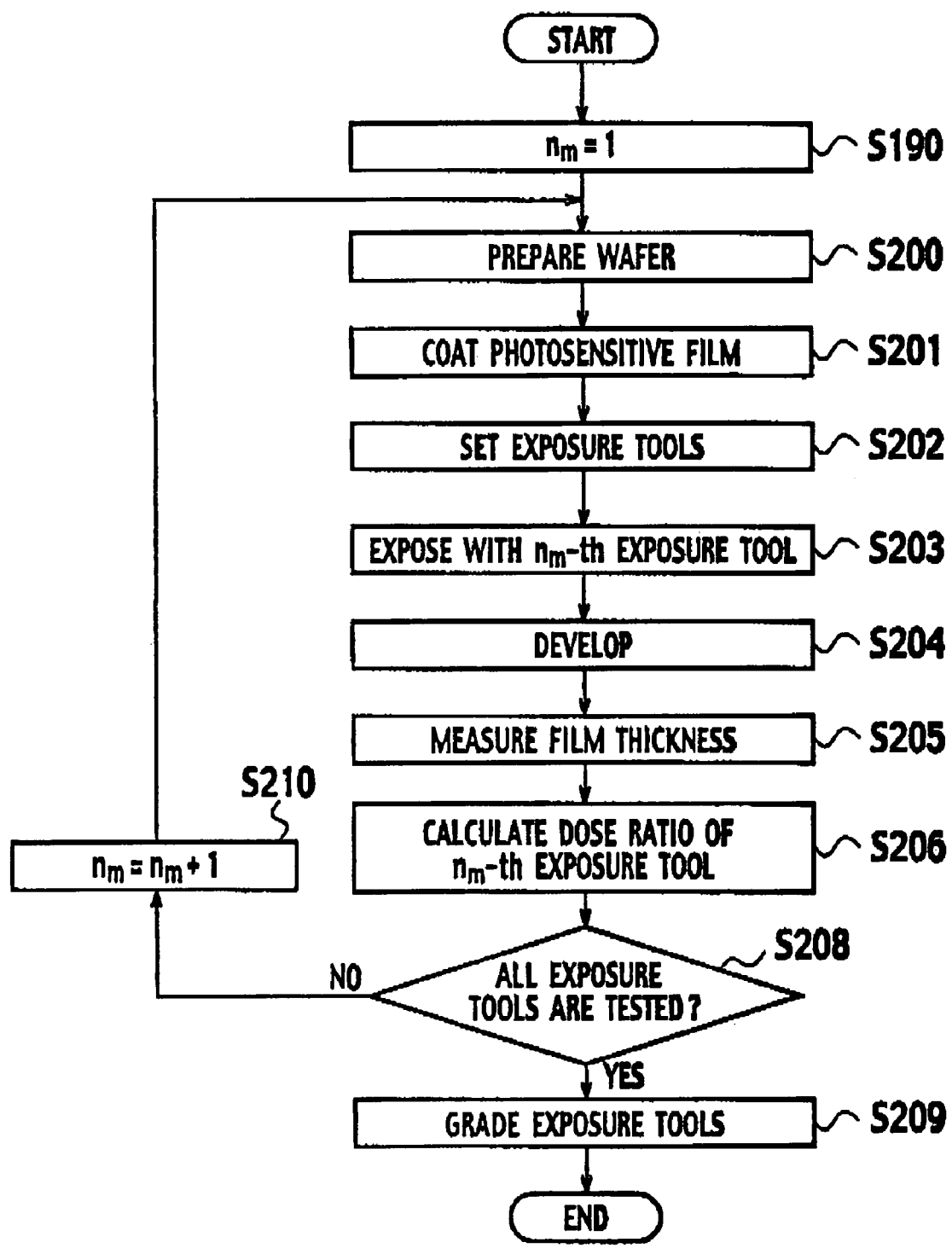
FIG. 16 is a flowchart depicting the method for testing the polarization state in accordance with the second embodiment of the present invention.

With reference next to FIG. 16, the method for testing the polarization state according to the second embodiment is described.

In step S190, the exposure tool controller 326, shown in FIG. 15, assigns "one" to the internal counter "$n_M$". Then, step S200 and step S201 are carried out similar to step S100 and step S101 of FIG. 13. In step S202, the test wafer 15 is disposed on the wafer stage 32 of the "$n_N$"-th exposure tool chosen from among the plurality of exposure tools 3a-3n. Also, the transparent mask substrate composed of $SiO_2$ and having no patterns is disposed on the reticle stage 51. Next, the exposure tool controller 326, shown in FIG. 15, controls the polarization direction of the polarized light by transmitting instructions to the polarizer rotator 70, shown in FIG. 2, to adjust the position of the polarizer 59.

Step S203 is carried out similar to step S103 of FIG. 13 by using the "$n_M$"-th exposure tool. Then, step S204 and step S205 of FIG. 16 are carried out similar to step S104 and step S105 of FIG. 13. In step S206 of FIG. 16, the dose ratio calculator 341, shown in FIG. 15, calculates the dose ratio "$R_E$" similar to step S106 of FIG. 13. Next, the dose ratio calculator 341 fetches the internal counter number "$n_M$" from the exposure tool controller 326. The dose ratio calculator 341 stores the calculated dose ratio "$R_E$" in the dose ratio memory module 204 as the dose ratio "$R_E$" of the "$n_M$"-th exposure tool.

In step S208, the exposure tool controller 326 determines whether the assigned value of the internal counter "$n_M$" is greater than the total number of the plurality of exposure tools 3a-3n. The total number is stored in the test condition memory module 205. When the assigned value of the internal counter "$n_M$" is less than the total number, step S210 is the next procedure. In step S210, the exposure tool controller 326 ads one to the internal counter "$n_M$". When the assigned value of the internal counter "$n_M$" is greater than the total number, step S209 is the next procedure. In step S209, each dose ratio "$R_E$" of the plurality of exposure tools 3a-3n has been stored in the dose ratio memory module 204.

In step S209, the comparative module 343 fetches each dose ratio "$R_E$" of the plurality of exposure tools 3a-3n from the dose ratio memory module 204. The comparative module 343 determines whether the dispersion of the dose ratios "$R_E$" of the plurality of exposure tools 3a-3n is less than the tolerance stored in the test condition memory module 205. When the dispersion of the dose ratios "$R_E$" of the plurality of exposure tools 3a-3n is less than the tolerance, the comparative module 343 ranks the plurality of exposure tools 3a-3n hierarchically based on the dose ratio "$R_E$". Thereafter, the comparative module 343 chooses the exposure tool having the lowest dose ratio "$R_E$" among the plurality of exposure tools 3a-3n. The exposure tool having the lowest dose ratio "$R_E$" makes it possible to emit polarized light having a degree of polarization closest to one.

As described above, the system for testing the polarization state, shown in FIG. 15, and the method for testing the polarization state, shown in FIG. 16, make it possible to compare the degrees of the polarization of the plurality of exposure tools 3a-3n. When the precision semiconductor device is manufactured, the exposure tool emitting polarized light which having a degree of polarization closest to one is chosen in step S209. By using the chosen exposure tool having the lowest dose ratio "$R_E$", it is possible to increase the yield rate of the semiconductor device.

MODIFICATION

Figure 17:
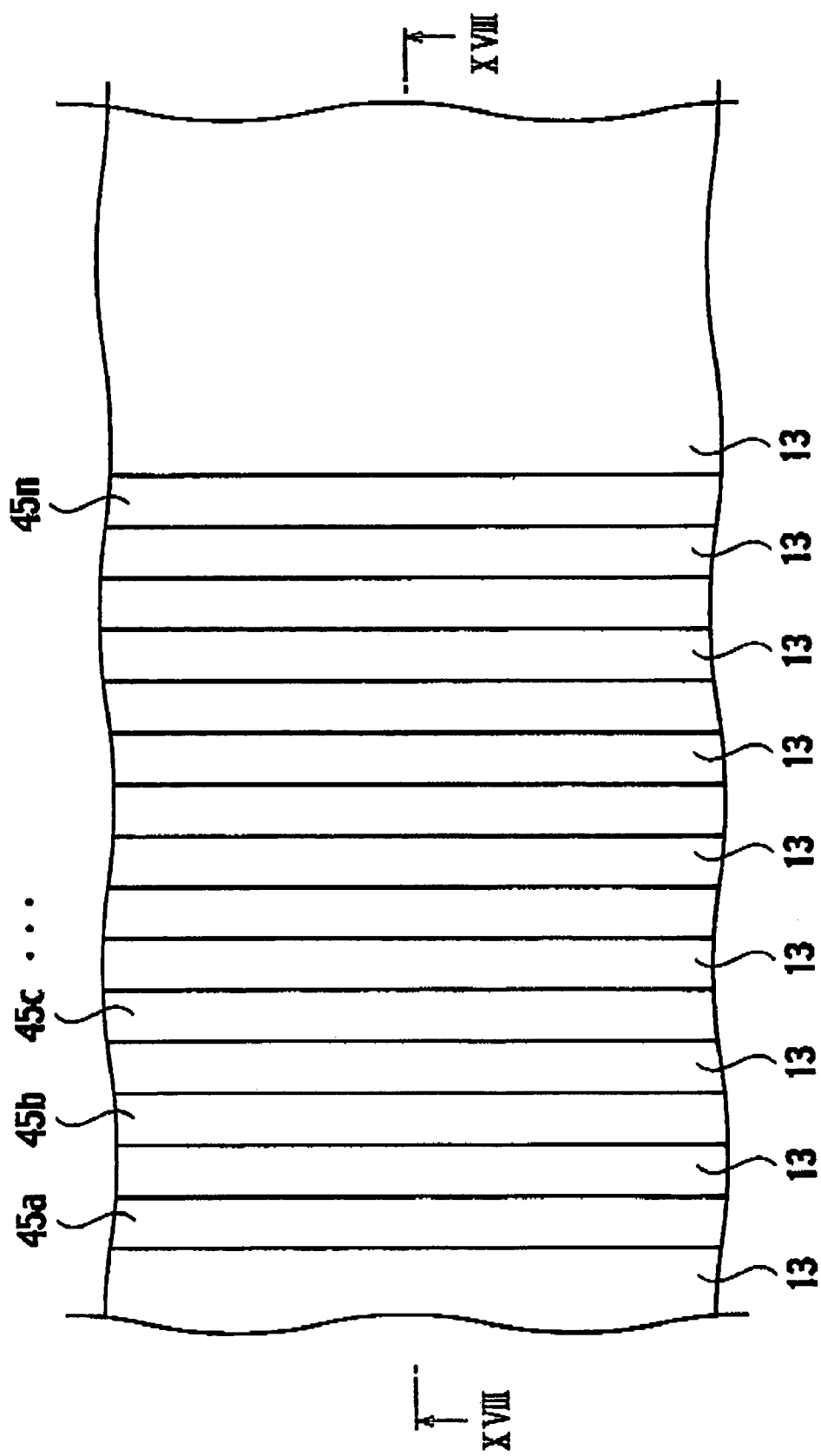
FIG. 17 is an enlarged plan view of the test substrate in accordance with a modification of the embodiment of the present invention.
Figure 18:
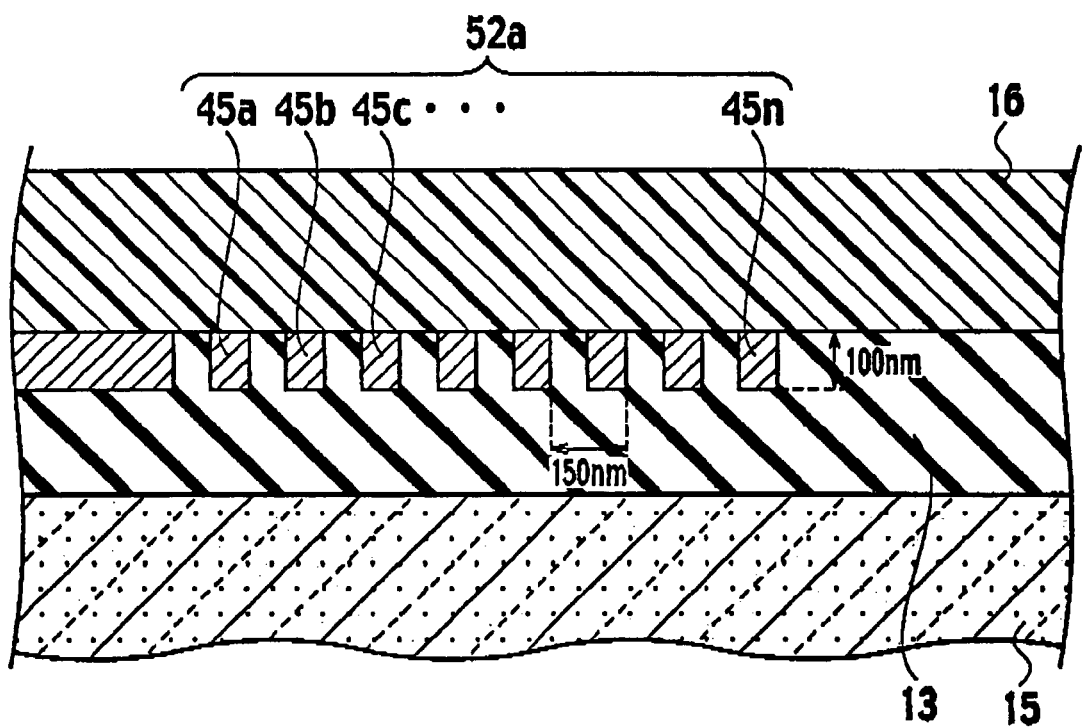
FIG. 18 is a cross sectional view of the test substrate shown in FIG. 17 cut from the direction of the line XVIII-XVIII in accordance with the modification of the embodiment of the present invention.

With reference to FIG. 8, by increasing a change of the dose ratio "$R_E$" versus a change of the angle θ between the groove and the vibration direction of the electric vector of the polarized light, it is possible to increase the sensitivity for testing the degree of polarization. With reference to FIG. 17 and FIG. 18, the test substrate according to the modification of the embodiment includes the test wafer 15, an insulator 13 disposed on the test wafer 15, a grid pattern 52a delineated in the insulator 13, and the test photosensitive film 16 coated on the insulator 13. The grid pattern 52a includes a plurality of parallel metal portions 45a, 45b, 45c, -, 45n. The parallel metal portions 45a-45n are embedded in the insulator 13. For example, the test wafer 15 is composed of Si. The insulator 13 is composed of silicon dioxide ($SiO_2$). The parallel metal portions 45a-45n are composed of copper (Cu). The test photosensitive film 16 is composed of the photoresist. The difference between a dielectric constant of a dielectric substance such as $SiO_2$, and a dielectric constant of an electric conductor, such as Cu, is large. Therefore, the difference between the refractive index of the insulator 13 and each refractive index of the metal portions 45a-45n is large. Accordingly, as the vibration direction of the electric vector of the polarized light becomes perpendicular to each lengthwise direction of the metal portions 45a-45n, the reflectance of the polarized light incident on the grid pattern 52a becomes lower than the reflectance of the polarized light incident on the grid pattern 25a, shown in FIG. 5. Therefore, it is possible to increase the sensitivity for detecting the change of the dose ratio "$R_E$".

With reference next to FIGS. 19-23, a method for manufacturing the test substrate, shown in FIG. 18, is described.

Figure 19:
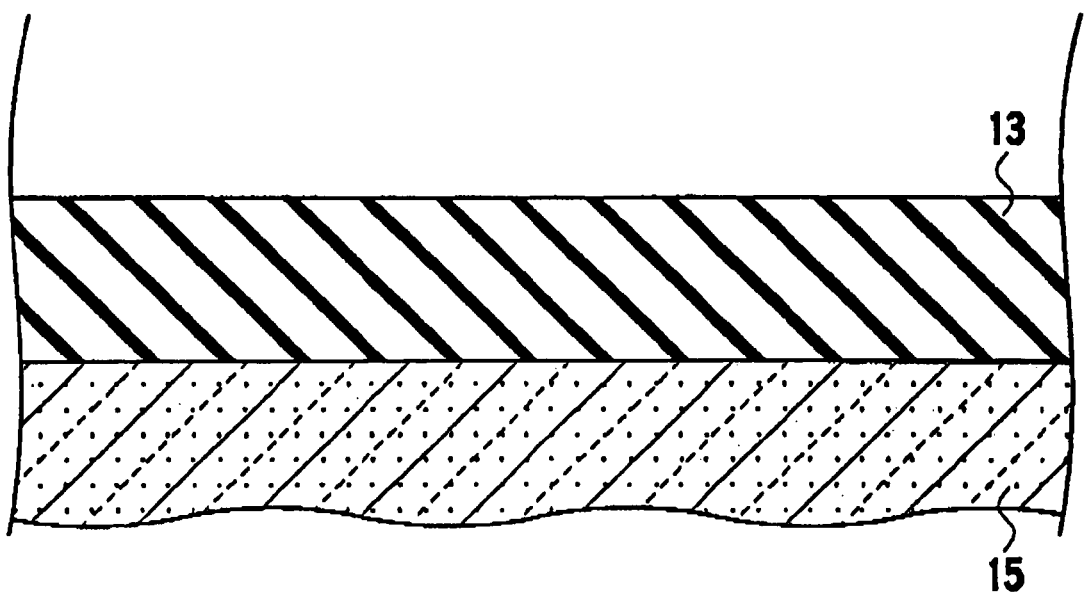
FIG. 19 is a first sectional view of the test substrate depicting a manufacturing process in accordance with the modification of the embodiment of the present invention.
Figure 20:
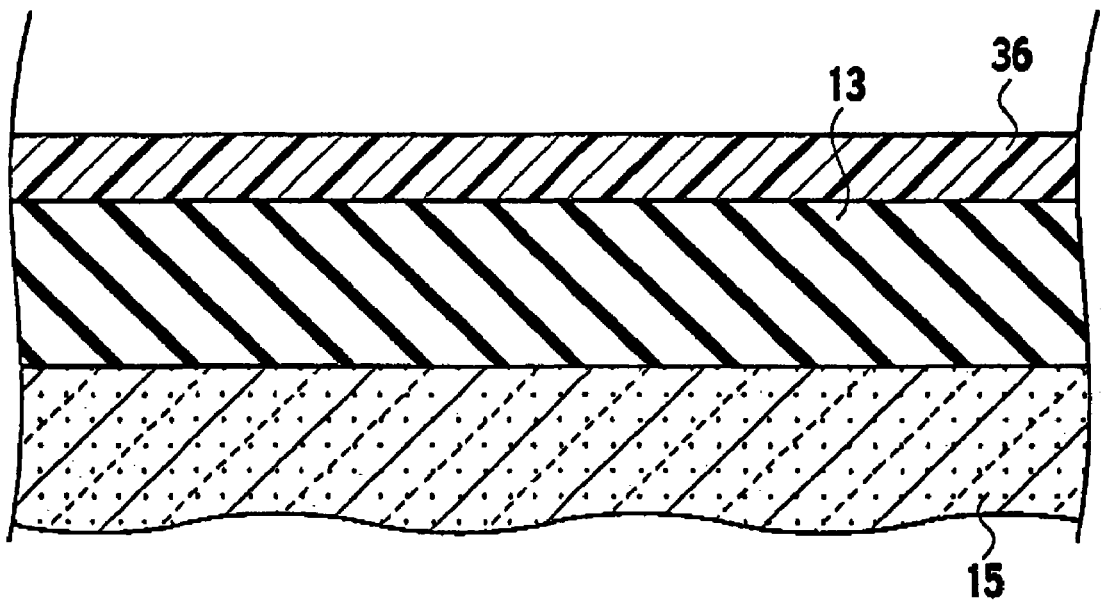
FIG. 20 is a second sectional view of the test substrate depicting the manufacturing process in accordance with the modification of the embodiment of the present invention.
Figure 21:
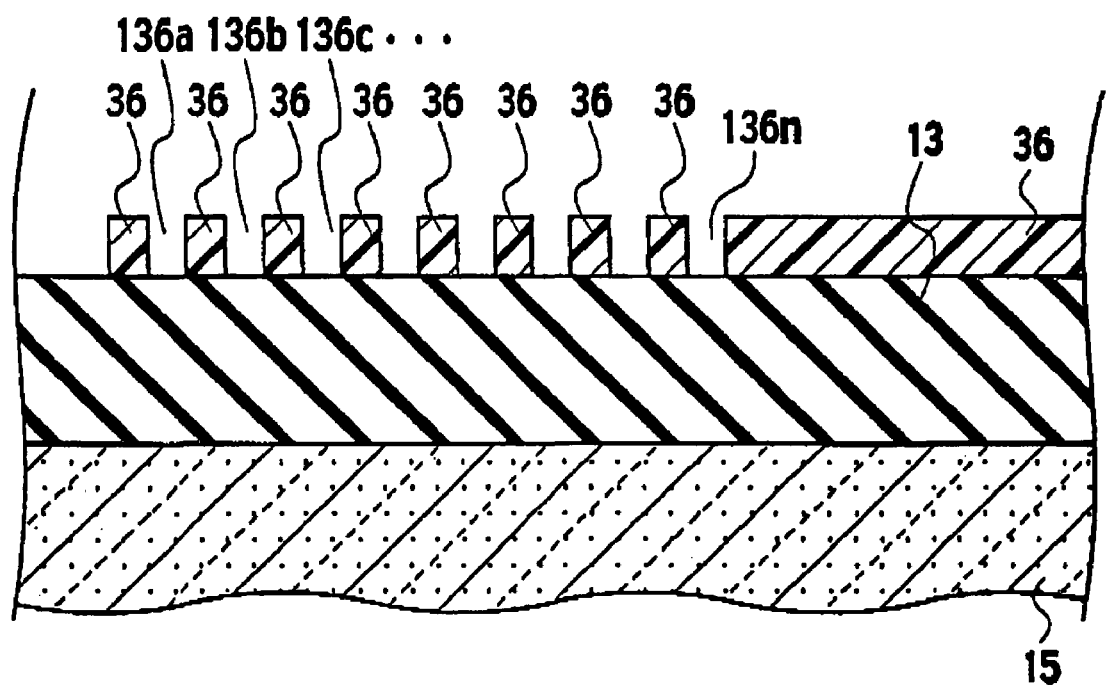
FIG. 21 is a third sectional view of the test substrate depicting the manufacturing process in accordance with the modification of the embodiment of the present invention.

In FIG. 19, the insulator 13 is deposited on the test wafer 15 by using plasma chemical vapor deposition (CVD) of tetraethylorthosilicate (TEOS). In FIG. 20, a resist film 36 is coated on the insulator 13 by using the spin coater, for example. In FIG. 21, a plurality of openings 136a, 136b, 136c, -, 136n are formed in the resist film 36 by lithography to expose portions of the insulator 13.

Figure 22:
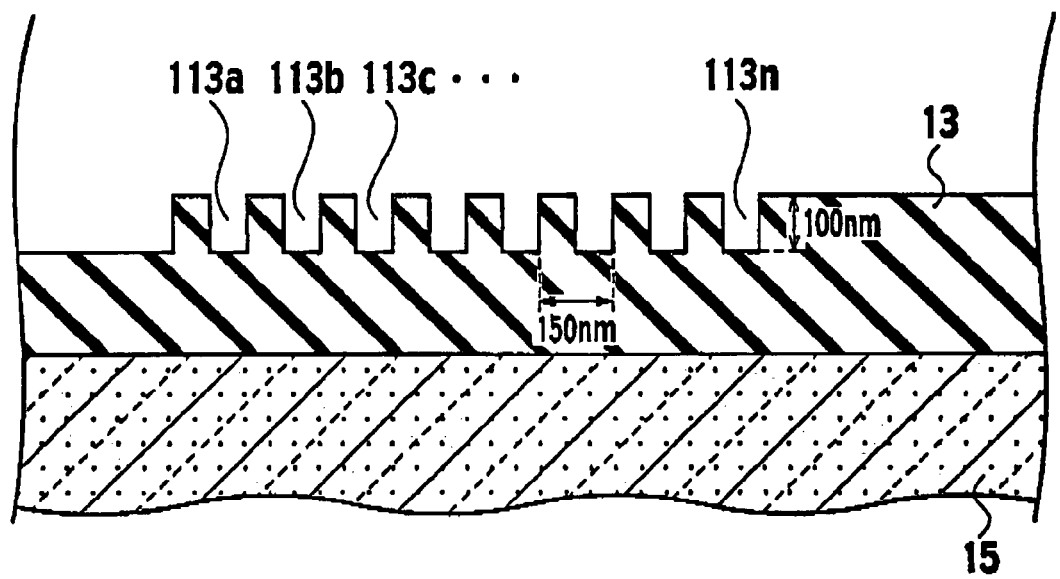
FIG. 22 is a fourth sectional view of the test substrate depicting the manufacturing process in accordance with the modification of the embodiment of the present invention.
Figure 23:
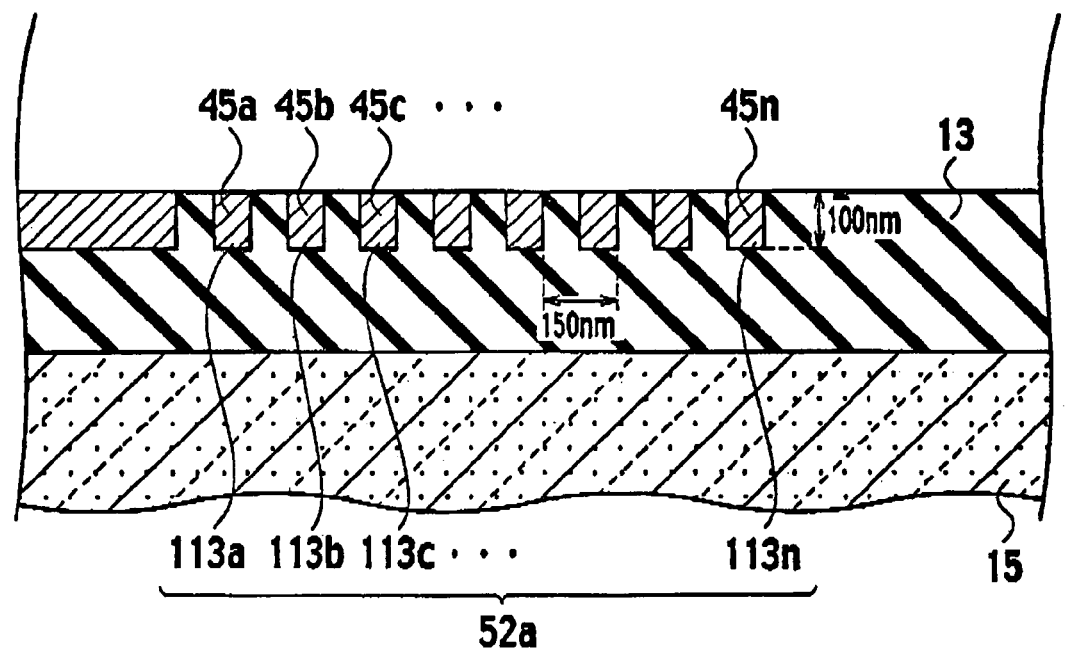
FIG. 23 is a fifth sectional view of the test substrate depicting the manufacturing process in accordance with the modification of the embodiment of the present invention.

The exposed portions of the insulator 13 are selectively removed by using the resist film 36 as an etch mask. In FIG. 22, the plurality of grooves 113a, 113b, 113c, -, 113n are formed in the insulator 13. Then, Cu is deposited on the insulator 13 by electroplating and is polished by a chemical mechanical planarization (CMP) process in FIG. 23. Consequently, the plurality of grooves 113a-113n are filled up with the plurality of metal portions 45a, 45b, 45c, . . . , 45n, respectively. Finally, the test photosensitive film 16 is coated on the insulator 13 by using the spin coater to obtain the test substrate according to the modification of the embodiment, shown in FIG. 18.

As described above, by using the test substrate, shown in FIG. 17 and FIG. 18, for the method for testing the polarization state, shown in FIG. 13 or FIG. 16, it is possible to increase the sensitivity for testing the polarization state of the polarized light.

THIRD EMBODIMENT

Figure 24:
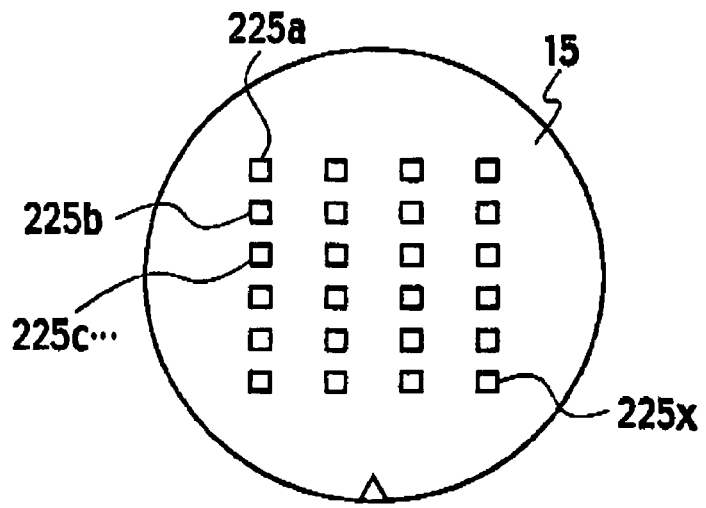
FIG. 24 is a plan view of the test substrate in accordance with a third embodiment of the present invention.
Figure 25:
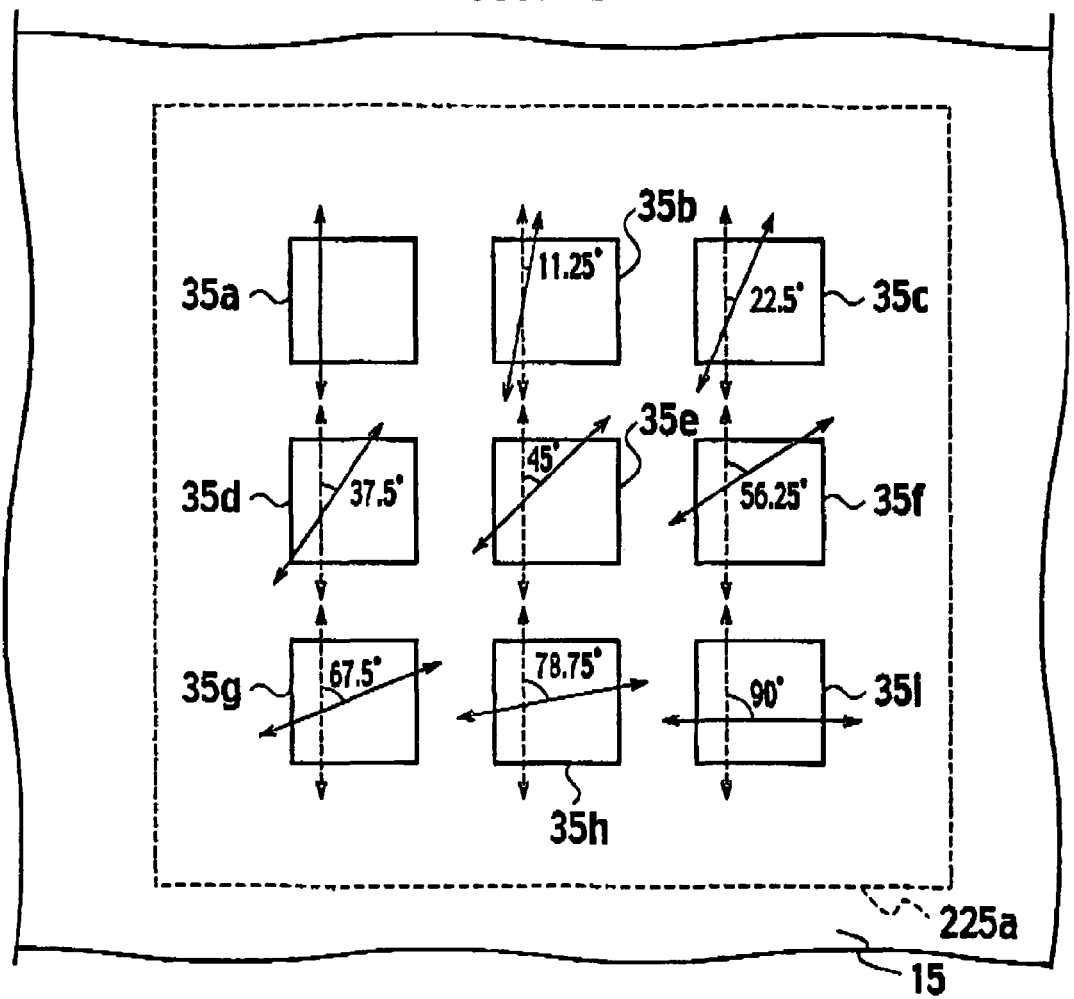
FIG. 25 is an enlarged plan view of the test substrate in accordance with the third embodiment of the present invention.

A figure of the system for testing the polarization state according to the third embodiment is similar to FIG. 1. With reference to FIG. 24, the test substrate according to the third embodiment includes the test wafer 15. A plurality of grid pattern groups 225a, 225b, 225c, -, 225x are delineated in the test wafer 15. The test photosensitive film is coated on the test wafer 15. With reference to FIG. 25, a plurality of grid patterns 35a, 35b, 35c, 35d, 35e, 35f, 35g, 35h, 35i are delineated in the grid pattern group 225a. The lengthwise directions of the grooves in the grid patterns 35a-35i are different. The sectional view of the grid pattern 35a is similar to FIG. 5. The grooves delineated in the grid patterns 35a-35i, shown in FIG. 25, have the same pitch. It should be noted that each inclination of the lengthwise directions of the grooves in the grid pattern 35b to the lengthwise directions of the grooves in the grid pattern 35a is 11.25 degrees. Each inclination of lengthwise directions of the. grooves in the grid pattern 35c to the lengthwise directions of the grooves in the grid pattern 35a is 22.5 degrees. Each inclination of the lengthwise directions of the grooves in the grid pattern 35d to the lengthwise directions of the grooves in the grid pattern 35a is 37.5 degrees. Each inclination of the lengthwise directions of the grooves in the grid pattern 35e to the lengthwise directions of the grooves in the grid pattern 35a is 45 degrees. Each inclination of the lengthwise directions of the grooves in the grid pattern 35f to the lengthwise directions of the grooves in the grid pattern 35a is 56.25 degrees. Each inclination of the lengthwise directions of the grooves in the grid pattern 35g to the lengthwise directions of the grooves in the grid pattern 35a is 67.5 degrees. Each inclination of the lengthwise directions of the grooves in the grid pattern 35h to the lengthwise directions of the grooves in the grid pattern 35a is 78.75 degrees. Each inclination of the lengthwise directions of the grooves in the grid pattern 35i to the lengthwise directions of the grooves in the grid pattern 35a is 90 degrees. With reference again to FIG. 24, each of the plurality of grid patterns 225b-225x includes the plurality of grid patterns 35a-35i of which the lengthwise directions are different, similar to the grid pattern group 225a shown in FIG. 25.

Figure 26:
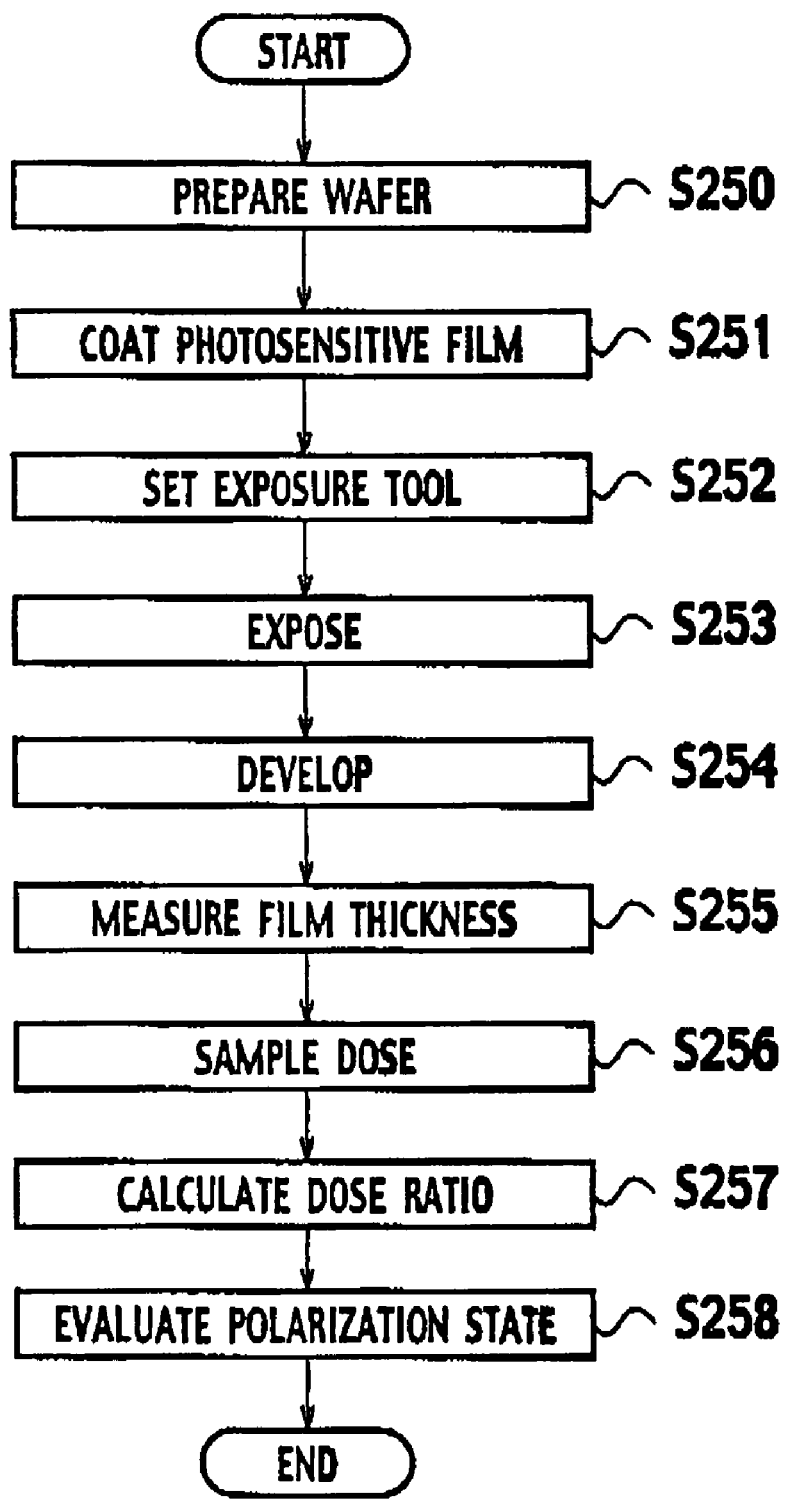
FIG. 26 is a flowchart depicting the method for testing the polarization state in accordance with the third embodiment of the present invention.

With reference to FIG. 26, the method for testing the polarization state according to the third embodiment is described.

In step S250, the test wafer 15 having the plurality of grid pattern groups 225a-225x, shown in FIGS. 24 and 25, is prepared. In step S251, the test photosensitive film 16 is coated on the test wafer 15 by the spin coater as shown in FIG. 5. A positive photoresist can be used for the test photosensitive film 16. In step S252, the test wafer 15, shown in FIG. 24, is disposed on the wafer stage 32, shown in FIG. 2. Also, the transparent mask substrate composed of the quartz glass and having no patterns is disposed on the reticle stage 51.

In step S253, the exposure tool controller 326, shown in FIG. 1, fetches the plurality of exposure conditions 6A-6X, shown in FIG. 9, from the exposure condition memory module 201. The exposure tool 3, shown in FIG. 2, exposes the portions of the test photosensitive film 16 on the plurality of grid pattern groups 225a-225x, shown in FIGS. 24 and 25, to the polarized light. The step and scan exposure tool 3 follows the plurality of exposure conditions 6A-6X and increase the dose step by step on the plurality of grid pattern groups 225a-225x.

In step S254, PEB is performed for the test photosensitive film 16. Then, the test photosensitive film 16 is developed by the developing tool 4. In step S255, each film thickness of the plurality of portions of the test photosensitive film 16 on the plurality of grid pattern groups 225a-225x, shown in FIGS. 24 and 25, is measured by the film thickness measurement tool 333, shown in FIG. 1. The film thickness measurement tool 333 transfers the plurality of measured film thicknesses of the test photosensitive film 16 to the dose ratio calculator 341. In step S256, the dose ratio calculator 341 finds the standard dose "$D_S$" to remove the test photosensitive film 16 from the flat surface of the test wafer 15. The dose ratio calculator 341 extracts the standard dose "$D_S$" from the plurality of exposure conditions 6A-6X, shown in FIG. 9.

Then, the dose ratio calculator 341 finds the first reference dose. "$D_{Ra}$" to remove the test photosensitive film 16 from the grid pattern 35a in one of the plurality of grid pattern groups 225a-225x, shown in FIG. 24. The dose ratio calculator 341 extracts the first reference dose "$D_{Ra}$" from the plurality of exposure conditions 6A-6X, shown in FIG. 9. Also, the dose ratio calculator 341 finds the second reference dose "$D_{Rb}$" to remove the test photosensitive film 16 from the grid pattern 35b, the third reference dose "$D_{Rc}$" to remove the test photosensitive film 16 from the grid pattern 35c, the fourth reference dose "$D_{Rd}$" to remove the test photosensitive film 16 from the grid pattern 35d, the fifth reference dose "$D_{Re}$" to remove the test photosensitive film 16 from the grid pattern 35e, the sixth reference dose "$D_{Rf}$" to remove the test photosensitive film 16 from the grid pattern 35f, the seventh reference dose "$D_{Rg}$" to remove the test photosensitive film 16 from the grid pattern 35g, the eighth reference dose "$D_{Rh}$" to remove the test photosensitive film 16 from the grid pattern 35h, and the ninth reference dose "$D_{Ri}$" to remove the test photosensitive film 16 from the grid pattern 35i. The dose ratio calculator 341 extracts the second to ninth reference doses "$D_{Ra}$"-"$D_{Ri}$" from the plurality of exposure conditions 6A-6X, shown in FIG. 9.

In step S257, the dose ratio calculator 341, shown in FIG. 1, calculates the first dose ratio "$R_{Ea}$" by dividing the first reference dose "$D_{Ra}$" by the standard dose "$D_S$". The dose ratio calculator 341 calculates the second dose ratio "$R_{Eb}$" by dividing the second reference dose "$D_{Rb}$" by the standard dose "$D_S$". The, dose ratio calculator 341 calculates the third dose ratio "$R_{Ec}$" by dividing the third reference dose "$D_{Rc}$" by the standard dose "$D_S$". The dose ratio calculator 341 calculates the fourth dose ratio "$R_{Ed}$" by dividing the fourth reference dose "$D_{Rd}$" by the standard dose "$D_S$". The dose ratio calculator 341 calculates the fifth dose ratio "$R_{Ea}$" by dividing the fifth reference dose "$D_{Re}$" by the standard dose "$D_S$". The dose ratio calculator 341 calculates the sixth dose ratio "$R_{Ef}$" by dividing the sixth reference dose "$D_{Rf}$" by the standard dose "$D_S$". The dose ratio calculator 341 calculates the seventh dose ratio "$R_{Eg}$" by dividing the seventh reference dose "$D_{Rg}$" by the standard dose "$D_S$". The dose ratio calculator 341 calculates the eighth dose ratio "$R_{Eh}$" by dividing the eighth reference dose "$D_{Rh}$" by the standard dose "$D_S$". The dose ratio calculator 341 calculates the ninth dose ratio "$R_{Ei}$" by dividing the eighth ninth dose "$D_{Ri}$" by the standard dose "$D_S$". The dose ratio calculator 341 stores the first to ninth dose ratio "$R_{Ea}$"-"$R_{Ei}$" in the dose ratio memory module 204.

Figure 27:
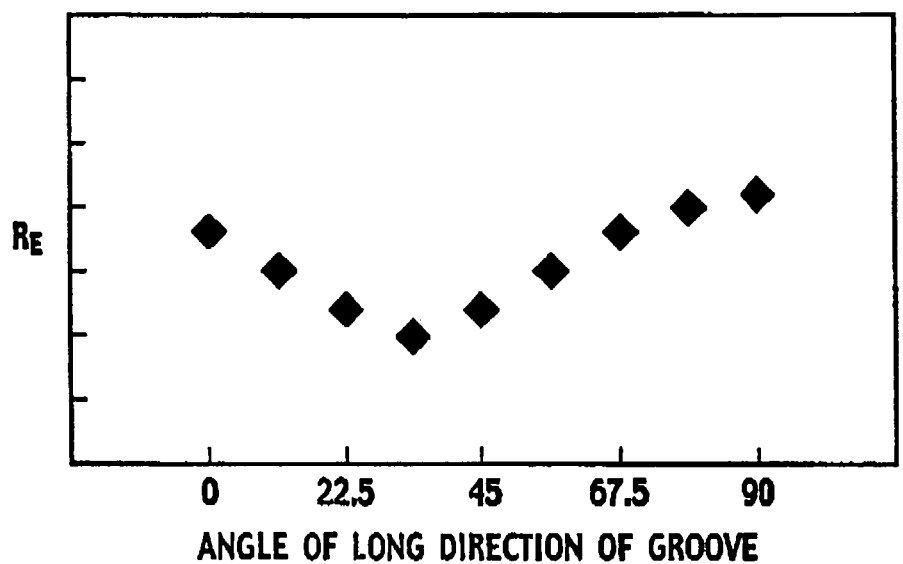
FIG. 27 is a graph of the dose ratio versus the angle between the groove of the grid pattern and the vibration direction of the electric vector of the light in accordance with the third embodiment of the present invention.

In step S258, the evaluator 342 fetches the first to ninth dose ratios "$R_{Ea}$"-"$R_{Ei}$" from the dose ratio memory module 204. The evaluator 342 extracts the lowest value among the first to ninth dose ratios "$R_{Ea}$"-"$R_{Ei}$". FIG. 27 shows the first to ninth dose ratio "$R_{Ea}$"-"$R_{Ei}$" versus the inclinations of the lengthwise directions of the grooves in the grid patterns 35b-35i to the lengthwise direction of the groove in the grid pattern 35a. Here, the fourth dose ratio "$R_{Ed}$" is the minimum among the first to ninth dose ratios "$R_{Ea}$"-"$R_{Ei}$". The fourth dose ratio "$R_{Ed}$" is calculated from the fourth reference dose "$D_{Rd}$" to remove the test photosensitive film 16 from the grid pattern 35d. The angle between the lengthwise directions of the grooves in the grid patterns 35a, 35d is 37.5 degrees. In this case, the evaluator 342 determines that the vibration direction of the electric vector of the polarized light is substantially parallel to the lengthwise directions of the grooves delineated in the grid pattern 35d.

As described above, by using the plurality of grid pattern groups 225a-225x having the plurality of grid patterns 35a-35i, shown in FIGS. 24 and 25, it is possible to analyze the vibration direction of the electric vector of the polarized light. In the third embodiment, the lengthwise directions of the grooves in the plurality of grid patterns 35a-35i are inclined at 11.25 degrees, one by one, as an example. However, a number of grid patterns may be delineated on the test wafer 15 to make the angles between the lengthwise directions of the grooves in the grid patterns small. By making the angles small, it is possible to increase the resolution of the method for testing the polarization state. As shown in FIG. 18, it is possible to arrange the plurality of electric conductors and the plurality of dielectric substances periodically in each of the plurality of grid patterns 35a-35i.

FOURTH EMBODIMENT

Figure 28:
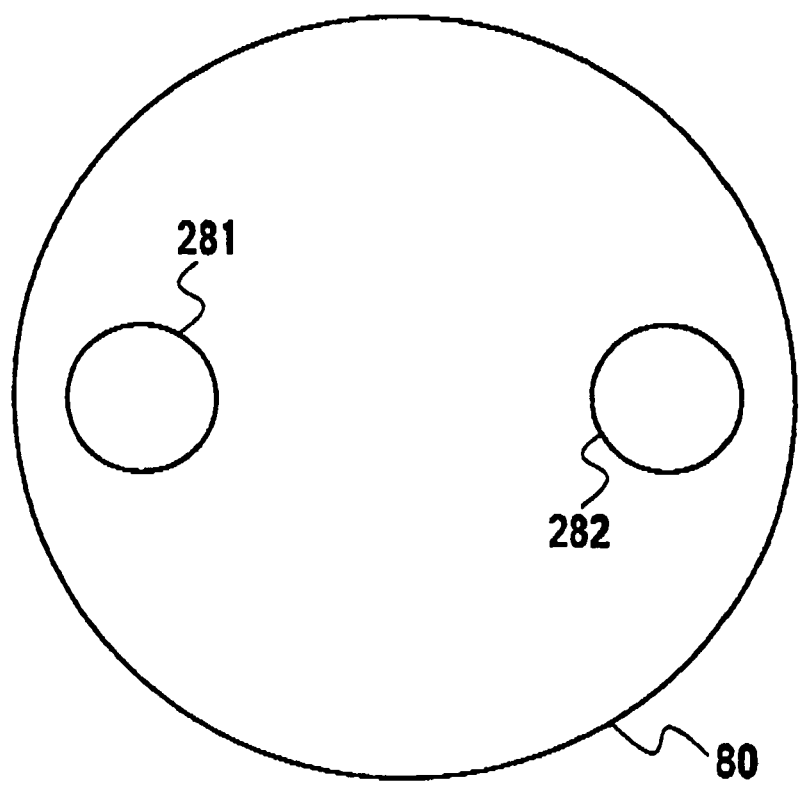
FIG. 28 is a plan view of an aperture diaphragm in accordance with a fourth embodiment of the present invention.
Figure 29:
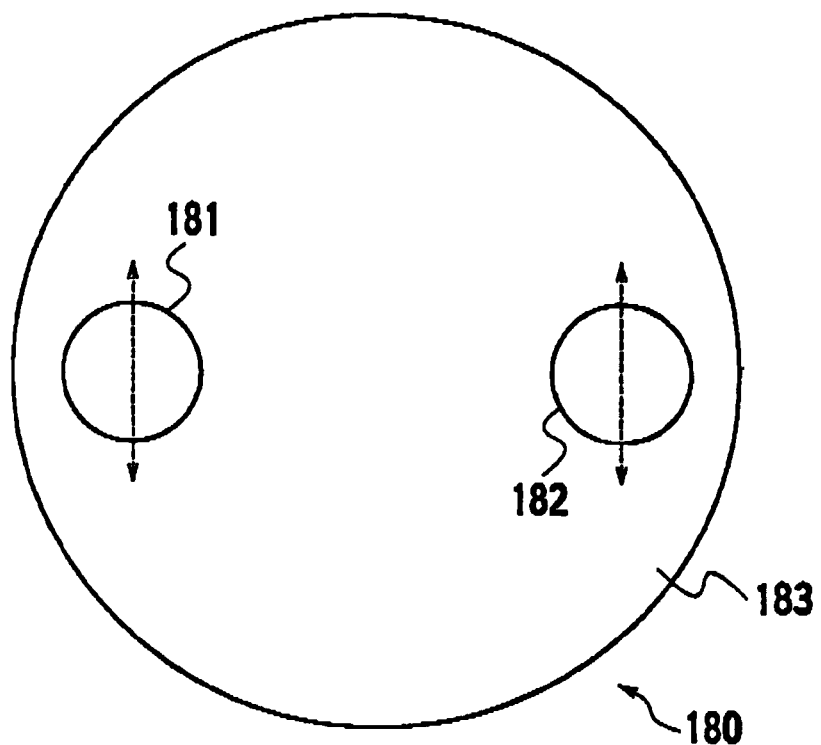
FIG. 29 is a plan view of an image of a secondary light source in the exposure tool in accordance with the fourth embodiment of the present invention.

A figure of the system for testing the polarization state according to the fourth embodiment is similar to FIG. 1. In the fourth embodiment, an aperture diaphragm 80 for dipole illumination, shown in FIG. 28, is inserted in the aperture diaphragm holder 58 of the exposure tool 3, shown in FIG. 2. The aperture diaphragm 80 for the dipole illumination has two openings 281, 282. As shown in FIG. 29, when the aperture diaphragm 80 for the dipole illumination is inserted into the aperture diaphragm holder 58, an image 180 of a secondary light source of the illumination optical system 14 includes two bright regions 181, 182 corresponding to the two openings 281, 282. The bright regions 181, 182 are surrounded by a dark region 183. The optical intensity of the dark region 183 is nearly zero. Arrows, shown in FIG. 29, indicate the vibration direction of the electric vector of the polarized light emitted from the bright regions 181, 182.

Figure 30:
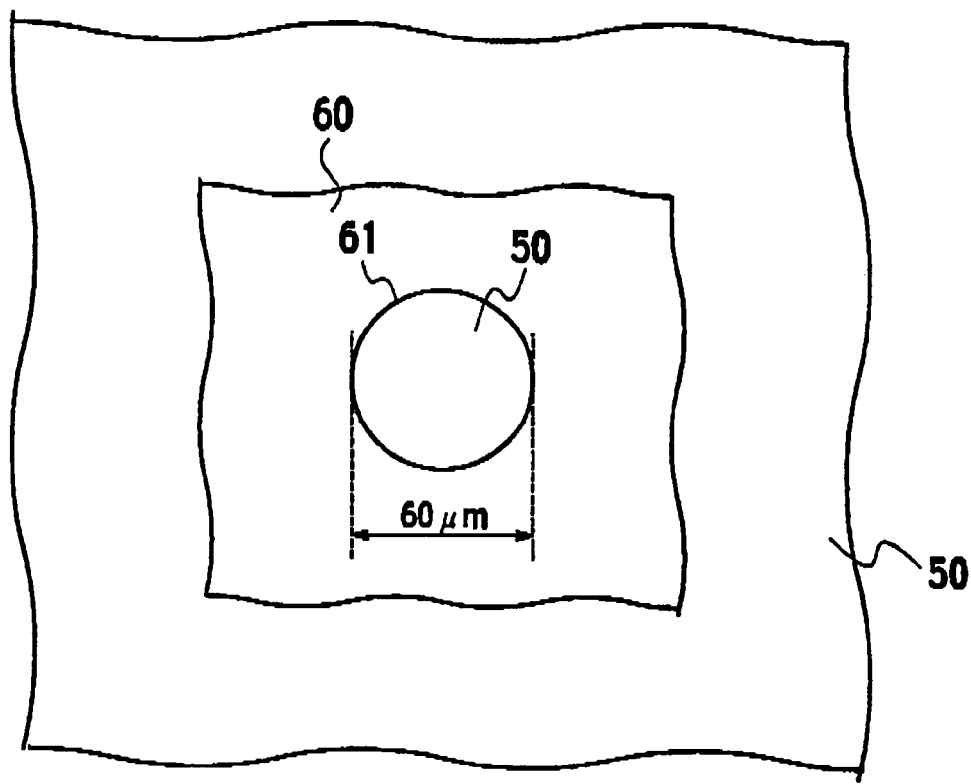
FIG. 30 is a plan view of a test mask in accordance with the fourth embodiment of the present inventions.

With reference to FIG. 30, a test mask according to the fourth embodiment includes a transparent test mask substrate 50 and a light shield test film 60 disposed on the test mask substrate 50. The thickness of the test mask substrate 50 is 6.35 mm. A circular pinhole 61 is delineated in the light shield test film 60. The diameter of the pinhole 61 is 60 micrometers. Quartz glass can be used as a material of the test mask substrate 50, for example. Cr can be used as a material of the light shield test film 60, for example. A portion of the test mask substrate 50 is exposed from the pinhole 61. The test mask is disposed on the reticle stage 51, shown in FIG. 2, so that the pinhole 61 and the surface of the test substrate are not optically conjugate. Therefore, the surface where the pinhole 61 is delineated is disposed up.

Figure 31:
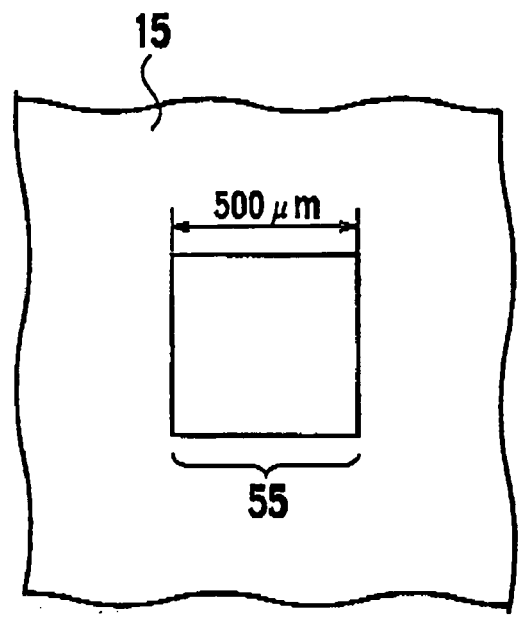
FIG. 31 is an enlarged plan view of the test substrate in accordance with the fourth embodiment of the present invention.
Figure 32:
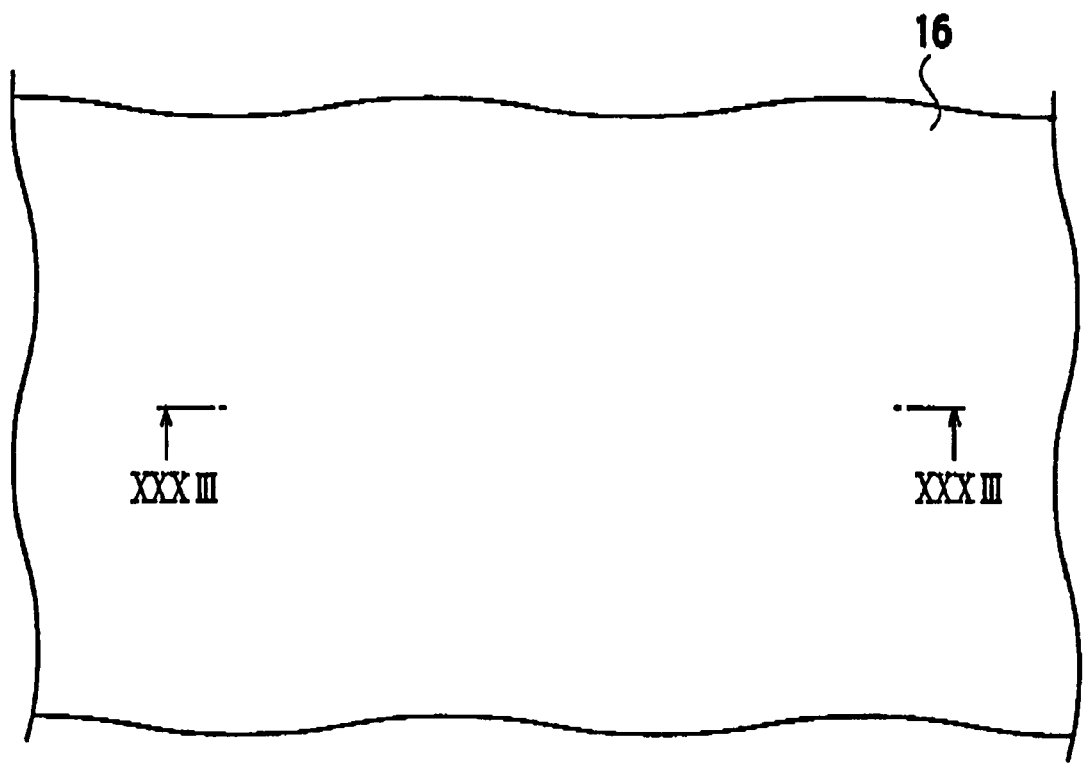
FIG. 32 is a first plan view of the test substrate in accordance with the fourth embodiment of the present invention.
Figure 33:
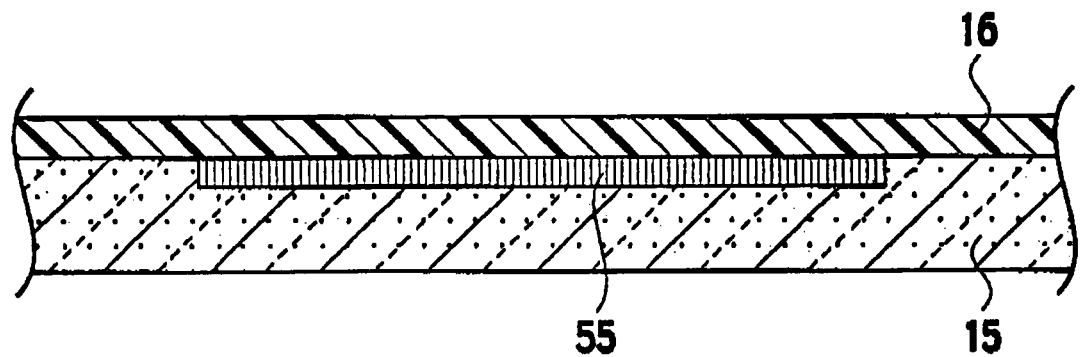
FIG. 33 is a first cross sectional view of the test substrate shown in FIG. 32 cut from a direction of line XXXIII-XXXIII in accordance with the fourth embodiment of the present inventions.

With reference to FIG. 31, the test substrate according to the fourth embodiment includes the test wafer 15. A grid pattern 55 is delineated on the test wafer 15. The shape of the grid pattern 55 is a square with 500 micrometer sides. The plurality of grooves are delineated in the grid pattern 55 similar to the grid pattern 25a, shown in FIG. 5. With reference to FIGS. 32 and 33, the test photosensitive film 16 is disposed on the test wafer 15.

Figure 34:
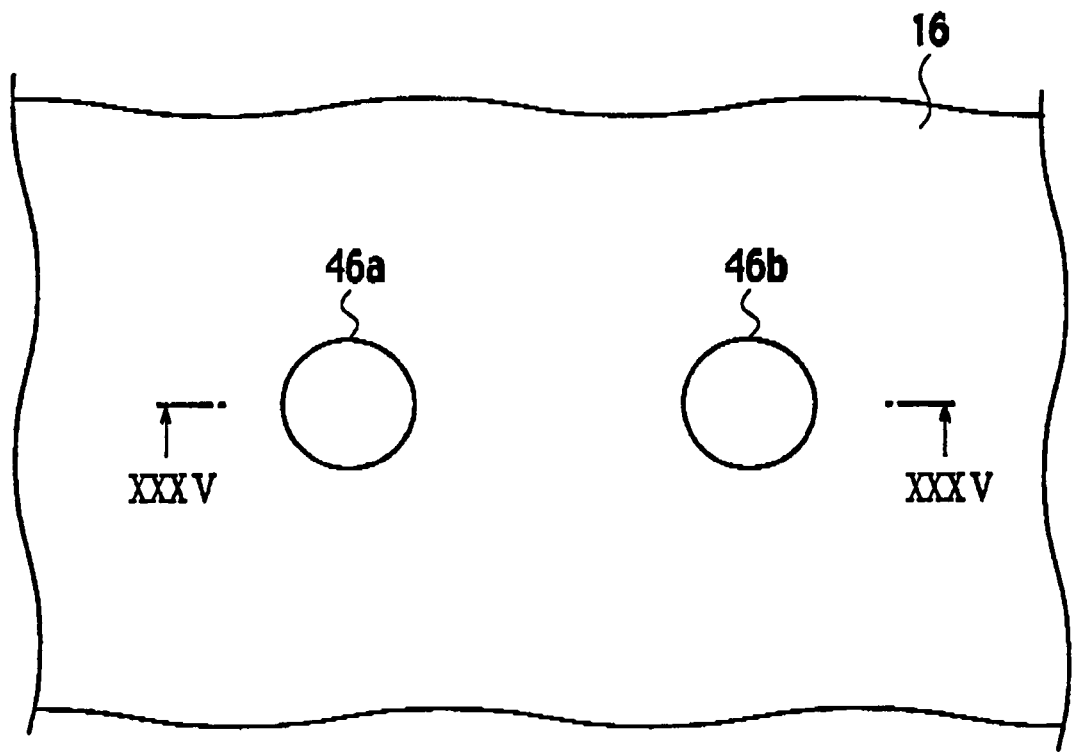
FIG. 34 is a second plan view of the test substrate in accordance with the fourth embodiment of the present invention.
Figure 35:
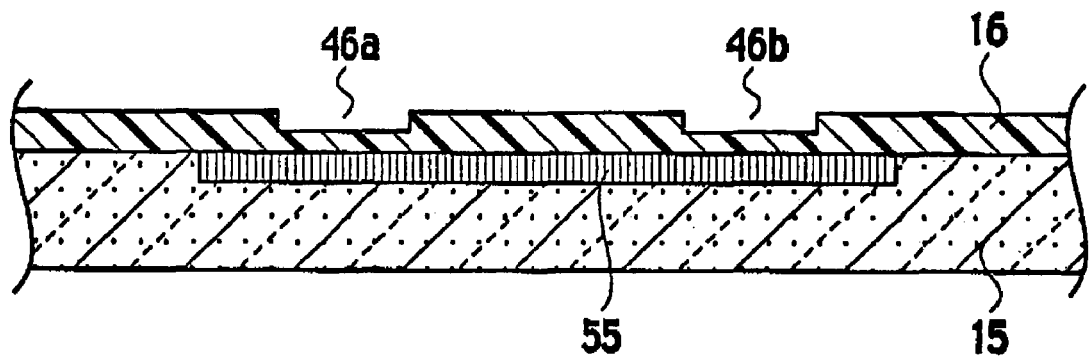
FIG. 35 is a second cross sectional view of the test substrate shown in FIG. 34 cut from a direction of line XXXV-XXXV in accordance with the fourth embodiment of the present invention.
Figure 36:
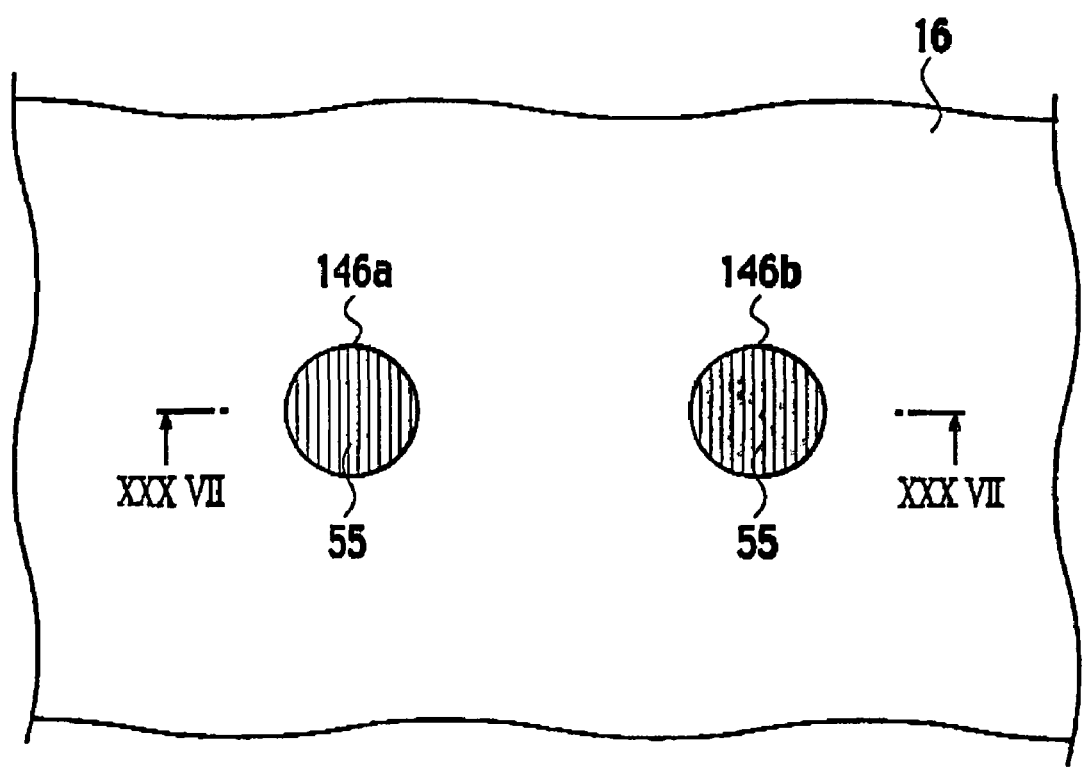
FIG. 36 is a third plan view of the test substrate in accordance with the fourth embodiment of the present invention.
Figure 37:
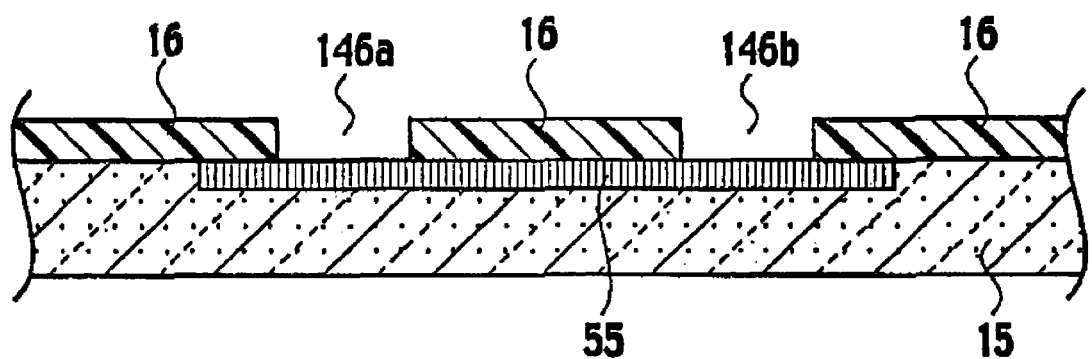
FIG. 37 is a third cross sectional view of the test substrate shown in FIG. 36 cut from a direction of line XXXVII-XXXVII in accordance with the fourth embodiment of the present invention.

When the exposure tool 3 exposes the test photosensitive film 16, shown in FIG. 33, to the polarized light by using the aperture diaphragm 80 for the dipole illumination, shown in FIG. 28, and the test mask, shown in FIG. 30, the image 180 of the secondary light source, shown in FIG. 29, is printed on the test photosensitive film 16. Here, it is assumed that the polarization direction of the polarized light is adjusted to be parallel with the lengthwise directions of the grooves in the grid pattern 55. When the degrees of polarization of the polarized lights emitted from the openings 281, 282, shown in FIG. 29, are equal, two hollows 46a, 46b are formed in the test photosensitive film 16, as shown in FIGS. 34 and 35, after the test photosensitive film 16 is developed. The hollows 46a, 46b have the same depth. When the test photosensitive film 16 is exposed to the polarized light at a stronger optical dose and developed, two holes 146a, 146b are formed in the test photosensitive film 16, as shown in FIGS. 36 and 37, and the portions of the grid pattern 55 are exposed.

Figure 38:
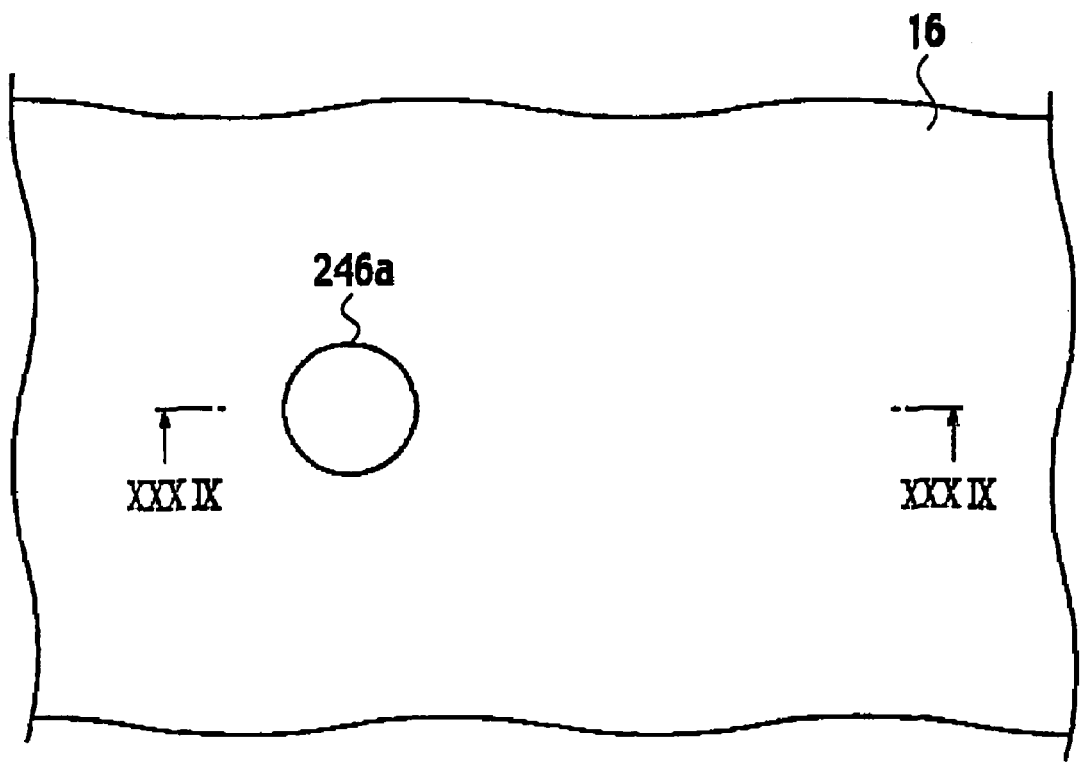
FIG. 38 is a fourth plan view of the test substrate in accordance with the fourth embodiment of the present invention.
Figure 39:
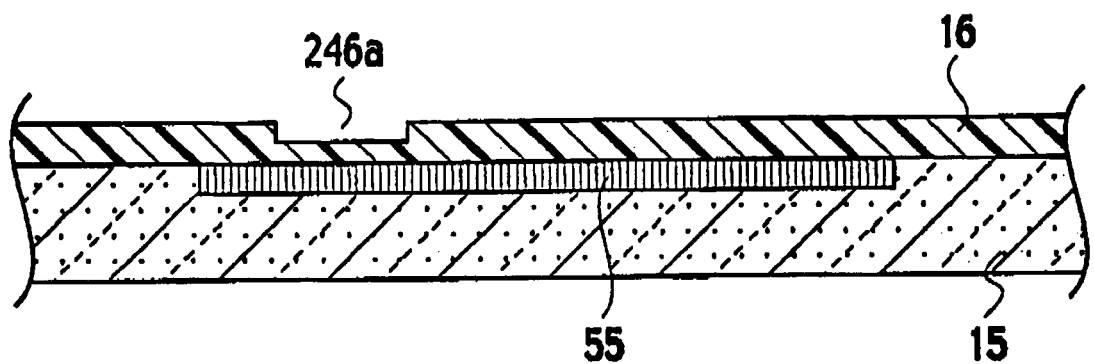
FIG. 39 is a fourth cross sectional view of the test substrate shown in FIG. 38 cut from a direction of line XXXIX-XXXIX in accordance with the fourth embodiment of the present invention.
Figure 40:
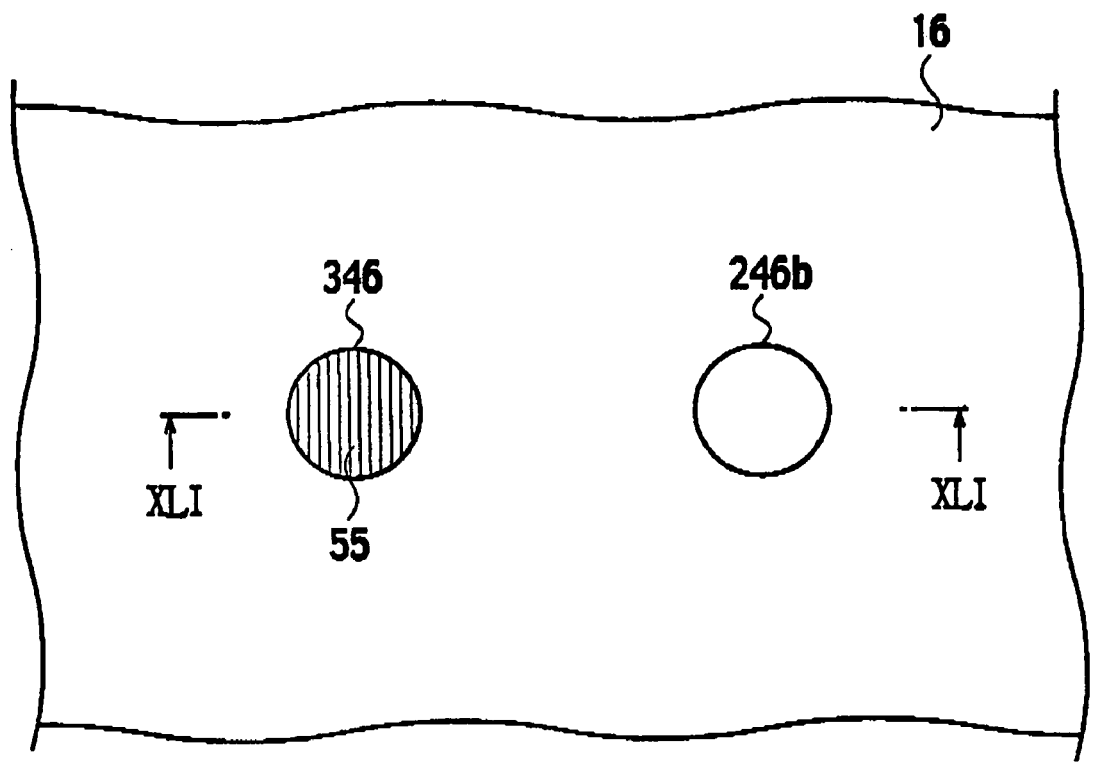
FIG. 40 is a fifth plan view of the test substrate in accordance with the fourth embodiment of the present invention.
Figure 41:
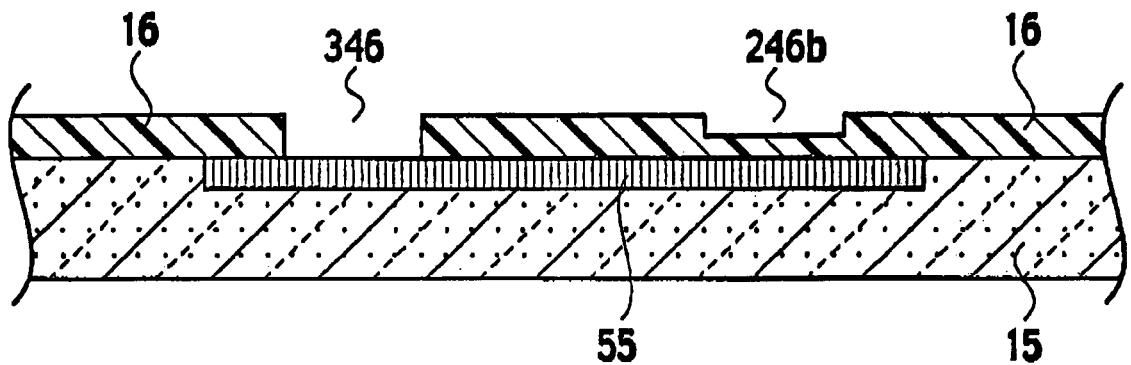
FIG. 41 is a fifth cross sectional view of the test substrate shown in FIG. 40 cut from a direction of line XLI-XLI in accordance with the fourth embodiment of the present invention.

When the degrees of polarization of the polarized lights emitted from the openings 281, 282, shown in FIG. 29, are different and the degree of polarization of the polarized light emitted from the opening 282 deteriorates, a hollow 246a, shown in FIGS. 38 and 39, is formed in the test photosensitive film 16 by the polarized light emitted from the opening 281 after the test photosensitive film 16 is developed. Since the degree of polarization of the polarized light emitted from the opening 282 deteriorates, the reflectance of the grid pattern 55 decreases. Therefore, the polarized light emitted from the opening 282 does not form the hollow in the test photosensitive film 16. When the test photosensitive film 16 is exposed to the polarized light at a stronger optical dose and developed, a hole 346 reaching to the grid pattern 55, shown in FIGS. 40 and 41, is formed in the test photosensitive film 16 by the polarized light emitted from the opening 281. Also, a hollow 246b is formed in the test photosensitive film 16 by the polarized light emitted from the opening 282.

Therefore, the aperture diaphragm 80 for the dipole illumination shown in FIG. 28, the test mask, shown in FIG. 30, and the test substrate, shown in FIG. 31, make it possible to analyze the distribution of the degree of polarization in the secondary light source, since the change in the property of the test photosensitive film 16 reflects the degree of polarization.

Figure 42:
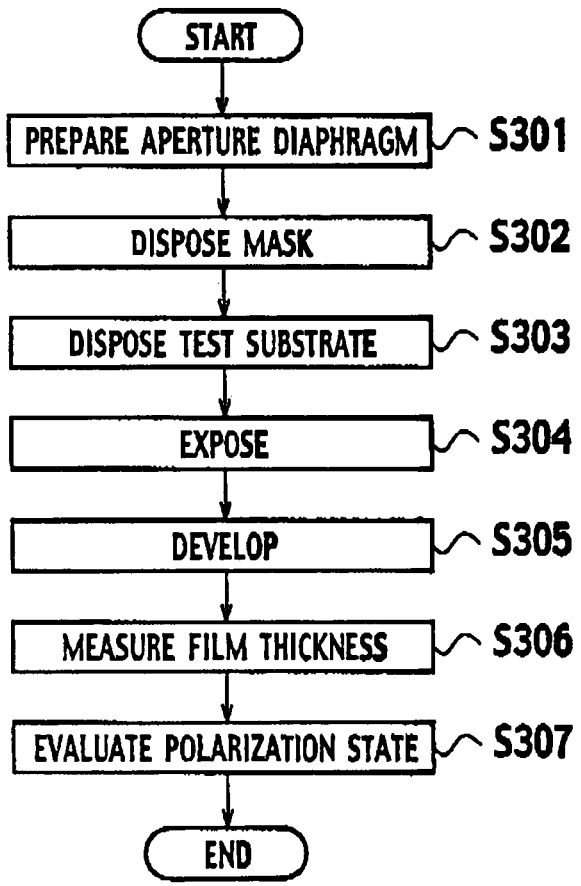
FIG. 42 is a flowchart depicting the method for testing the polarization state in accordance with the fourth embodiment of the present invention.

With reference next to FIG. 42, the method for testing the polarization state according to the fourth embodiment is described.

In step S301, the aperture diaphragm 80 for the dipole illumination, shown in FIG. 28, is inserted into the aperture diaphragm holder 58, shown in FIG. 2. In step S302, the test mask having the pinhole 61, shown in FIG. 30, is disposed on the reticle stage 51, shown in FIG. 2. In step S303, the test substrate including the test wafer 15, shown in FIGS. 31, 32, and 33, and the test photosensitive film 16 coated on the test wafer 15 is disposed on the wafer stage 32, shown in FIG. 2.

In step S304, the light source 41 emits the light and the test photosensitive film 16 coated on the grid pattern 55, shown in FIG. 31, is exposed to the polarized light. In step S305, the developing tool 4, shown in FIG. 1, develops the test photosensitive film 16. In step S306, the film thickness measurement tool 333 measures the change in the film thickness of the portions of the test photosensitive film 16 caused by each change of the properties of the test photosensitive film 16 exposed to the polarized light.

In step S307, the evaluator 342 determines the distribution of the degree of polarization in the secondary light source, based on the change of the film thickness of the test photosensitive film 16. Specifically, when the hollows 46a, 46b having the same depth, shown in FIGS. 34 and 35, are formed in the test photosensitive film 16, the evaluator 342 determines that the degrees of polarization of the polarized lights emitted from the openings 281, 282, shown in FIG. 29, are equal. When the hollow 246a, shown in FIGS. 38 and 39, is formed in the test photosensitive film 16 by the polarized light emitted from the opening 281, but the hollow is not formed in the test photosensitive film 16 by the polarized light emitted from the opening 282, the evaluator 342 determines that the degree of polarization of the polarized light emitted from the opening 282 deteriorates as compared with the polarized light emitted from the opening 281.

As described above, the method for testing the polarization state, according to the fourth embodiment, makes it possible to analyze the distribution of the degree of polarization in the secondary light source. The distribution of the degree of polarization in the secondary light source affects the image formation by the projection optical system 42, shown in FIG. 2. Therefore, by adjusting the degree of polarization of the polarized light emitted from the illumination optical system 14, based on the result of the method for testing the polarization state, according to the fourth embodiment, it is possible to increase the preciseness of the semiconductor device manufactured by the exposure tool 3. Also, it is possible to increase the yield rate of the semiconductor device.

In the grid pattern 15, shown in FIG. 31, it is possible to arrange the plurality of electric conductors and the plurality of dielectric substances periodically, as shown in FIG. 18. In the fourth embodiment, the dipole illumination by the aperture diaphragm 80, shown in FIG. 28, is described as an example. However, various multipole illuminations, such as quadrupole illumination, can be used for the method for testing the polarization state.

Further, the test mask substrate 50 coated by the light shield test film 60 having the 60 micrometer diameter pinhole 61, is shown in FIG. 30, is used in the fourth embodiment as an example. However, disposing a light shield test plate having a pinhole diameter similar to the pinhole 61 beneath the illumination optical system 14 or beneath the projection optical system 42 is an alternative. Such alternative also makes it possible to analyze the distribution of the degree of polarization in the secondary light source.

FIFTH EMBODIMENT

Figure 43:
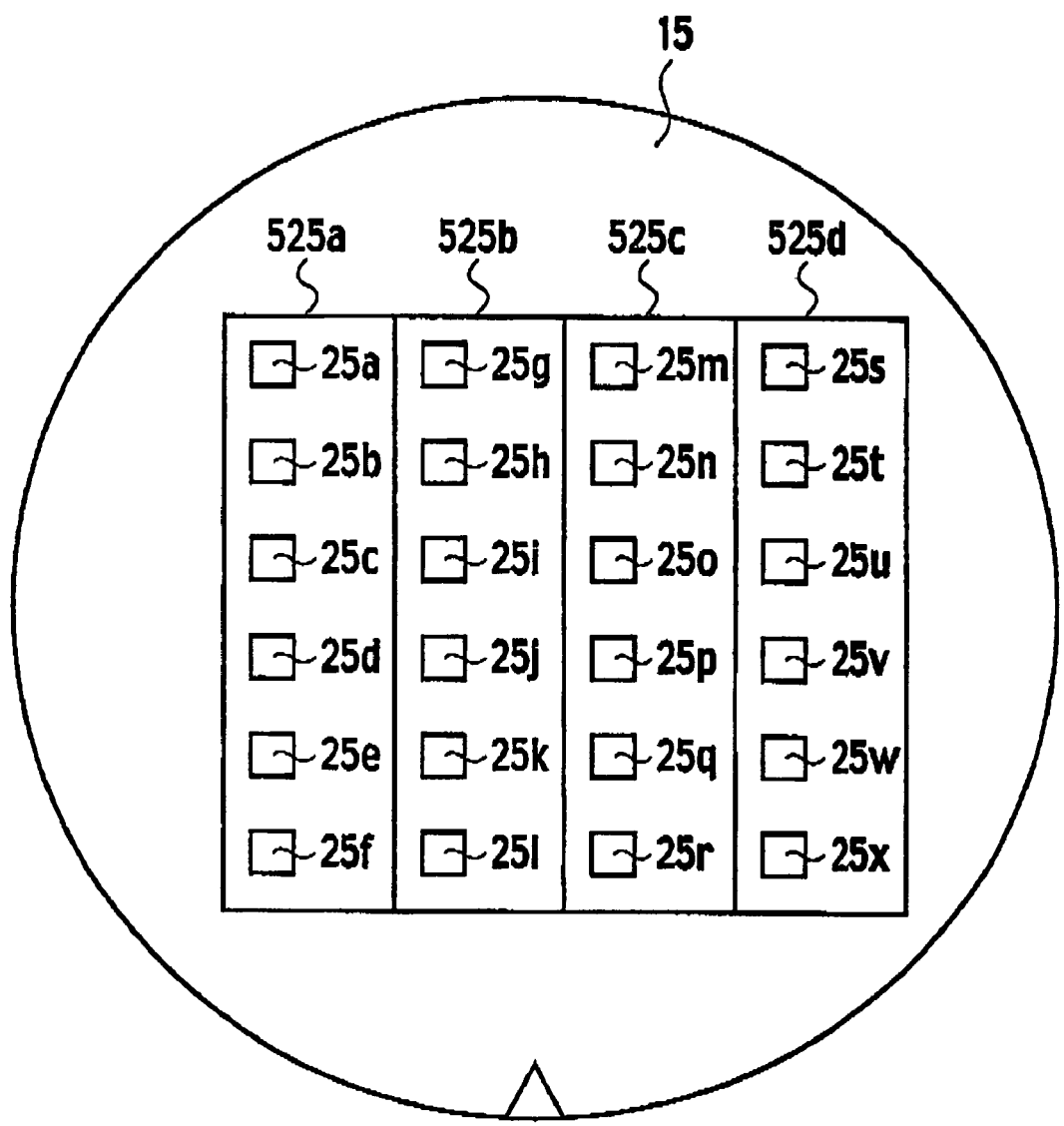
FIG. 43 is a plan view of the test substrate in accordance with a fifth embodiment of the present invention.

A figure of the system for testing the polarization state according to the fifth embodiment is similar to FIG. 1. With reference to FIG. 43, the exposure field of the test substrate, according to the fifth embodiment, is divided into a first divided field 525a, a second divided field 525b, a third divided field 525c, and a fourth divided field 525d. The first to fourth divided fields 525a-525d are exposed to the polarized light with the same exposure condition. Therefore, the plurality of grid patterns 25a, 25g, 25m, 25s are exposed to polarized light with the same optical dose. Also, the plurality of grid patterns 25b, 25h, 25n, 25t are exposed to polarized light with the same optical dose. Similarly, the plurality of grid patterns 25f, 25l, 25r, 25x are exposed to polarized light with the same optical dose.

Figure 44:
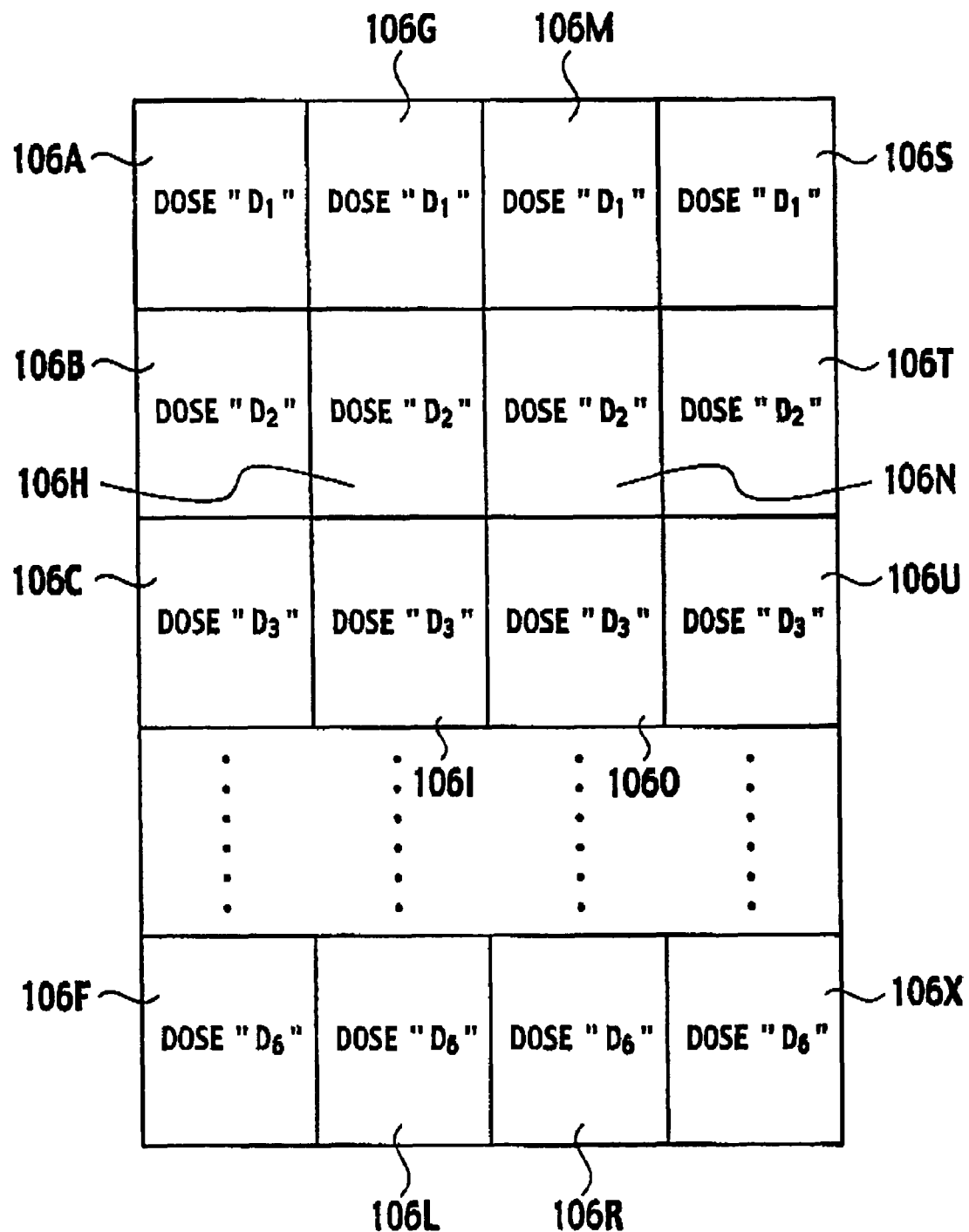
FIG. 44 illustrates the exposure conditions of the exposure tool in accordance with the fifth embodiment of the present invention.

The exposure condition memory module 201 shown in FIG. 1 stores the plurality of exposure conditions 106A, 106B, 106C, ..., 106F, 106G, 106H, 106I, ..., 106L, 106M, 106N, 106O, ..., 106R, 106S, 106T, 106U, ..., 106X shown in FIG. 44. The plurality of optical doses defined in the plurality of exposure conditions 106G-106L are equal to the plurality of optical, doses defined in the plurality of exposure conditions 106A-106F, respectively. The plurality of optical doses defined in the plurality of exposure conditions 106M-106R are equal to the plurality of optical doses defined in the plurality of exposure conditions 106A-106F, respectively. The plurality of optical doses defined in the plurality of exposure conditions 106M-106R are equal to the plurality of optical doses defined in the plurality of exposure conditions 106S-106X, respectively. The test condition memory module 205, shown in FIG. 1, stores the tolerance of the dispersion of the dose ratio "$R_E$".

With reference next to FIG. 45, the method for testing the polarization state according to the fifth embodiment is described.

In step S500, the test wafer 15 having the plurality of grid patterns 25a-25x, shown in FIG. 43, is prepared. In step S501, the test photosensitive film 16 is formed on the test wafer 15 by coating the positive photoresist on the test wafer 15, for example. In step S502, the test wafer 15 is disposed on the wafer stage 32, shown in FIG. 2. Also, the transparent mask substrate composed of quartz glass and having no patterns is disposed on the reticle stage 51. Then, the exposure tool controller 326, shown in FIG. 1, transmits instructions to the polarizer rotator 70, shown in FIG. 2, to adjust the displacement of the polarizer 59 to define the polarization direction of the polarized light.

In step S503, the exposure tool controller 326, shown in FIG. 1, fetches the plurality of exposure conditions 106A-106F, shown in FIG. 44, from the exposure condition memory module 201. The exposure tool controller 326 transmits instructions to the step and scan exposure tool 3, shown in FIG. 2, to expose the portions of the test photosensitive film 16 on the plurality of grid patterns 25a-25f and the flat surface in the first divided field 525a, shown in FIG. 43, to the polarized light by using the plurality of exposure conditions 106A-106F. The doses "$D_1$", "$D_2$", "$D_3$", -, "$D_{24}$" increases step by step.

In step S504, the exposure tool controller 326, shown in FIG. 1, fetches the plurality of exposure conditions 106G-106L, shown in FIG. 44, from the exposure condition memory module 201. The exposure tool controller 326 transmits instructions to the step and scan exposure tool 3, shown in FIG. 2, to expose the portions of the test photosensitive film 16 on the plurality of grid patterns 25g-25l and the flat surface in the second divided field 525b, shown in FIG. 43, to the polarized light by using the plurality of exposure conditions 106G-106L.

In step S505, the exposure tool controller 326, shown in FIG. 1, fetches the plurality of exposure conditions 106M-106R, shown in FIG. 44, from the exposure condition memory module 201, The exposure tool controller 326 transmits instructions to the step and scan exposure tool 3, shown in FIG. 2, to expose the portions of the test photosensitive film 16 on the plurality of grid patterns 25m-25r and the flat surface in the third divided field 525c, shown in FIG. 43, to the polarized light by using the plurality of exposure conditions 106M-106R.

In step S506, the exposure tool controller 326, shown in FIG. 1, fetches the plurality of exposure conditions 106S-106X, shown in FIG. 44, from the exposure condition memory module 201. The exposure tool controller 326 transmits instructions to the step and scan exposure tool 3, shown in FIG. 2, to expose the portions of the test photosensitive film 16 on the plurality of grid patterns 25s-25x and the flat surface in the fourth divided field 525d, shown in FIG. 43, to the polarized light by using the plurality of exposure conditions 106S-106X.

In step S507, PEB process is performed for the test photosensitive film 16. Then, the developing tool 4 develops the test photosensitive film 16. In step S508, the film thickness measurement tool 333 measures the film thicknesses of the portions of the test photosensitive film 16 on the plurality of grid patterns 25a-25x, shown in FIGS. 3, 4, and 5, and the flat surface of the test wafer 15. The film thickness measurement tool 333, shown in FIG. 1, transfers the measured film thicknesses of the test photosensitive film 16 to the dose ratio calculator 341.

In step S509, the dose ratio calculator 341 finds the standard dose "$D_{ED1}$" at the first divided field 525a to remove the test photosensitive film 16 from the flat surface of the test wafer 15, as shown in FIG. 7. The dose ratio calculator 341 extracts the standard dose "$D_{ED1}$" at the first divided field 525a from the plurality of exposure conditions 106A-106F, shown in FIG. 44. Then, the dose ratio calculator 341, shown in FIG. 1, finds the reference dose "$D_{RD1}$" at the first divided field 525a to remove the test photosensitive film 16 from one of the plurality of grid patterns 25a-25f. The dose ratio calculator 341 extracts the reference dose "$D_{RD1}$" at the first divided field 525a from the plurality of exposure conditions 106A-106F, shown in FIG. 44. Thereafter, the dose ratio calculator 341, shown in FIG. 1, calculates the dose ratio "$R_{ED1}$" at the first divided field 525a by dividing the reference dose "$D_{RD1}$" at the first divided field 525a by the standard dose "$D_{ED1}$" at the first divided field 525a. The dose ratio calculator 341 stores the calculated dose ratio "$R_{ED1}$" for the first divided field 525a in the dose ratio memory module 204.

In step S510, the dose ratio calculator 341 finds the standard dose "$D_{SD2}$" at the second divided field 525b to remove the test photosensitive film 16 from the flat surface of the test wafer 15, as shown in FIG. 7. The dose ratio calculator 341 extracts the standard dose "$D_{SD2}$" at the second divided field 525b from the plurality of exposure conditions 106G-106L, shown in FIG. 44. Then, the dose ratio calculator 341, shown in FIG. 1, finds the reference dose "$D_{RD2}$" at the second divided field 525b to remove the test photosensitive film 16 from one of the plurality of grid patterns 25g-25l. The dose ratio calculator 341 extracts the reference dose "$D_{RD2}$" for the second divided field 525b from the plurality of exposure conditions 106G-106L, shown in FIG. 44. Thereafter, the dose ratio calculator 341, shown in FIG. 1, calculates the dose ratio "$R_{ED2}$" at the second divided field 525b by dividing the reference dose "$D_{RD2}$" at the second divided field 525b by the standard dose "$D_{SD2}$" at the second divided field 525b. The dose ratio calculator 341 stores the calculated dose ratio "$R_{ED2}$" for the second divided field 525b in the dose ratio memory module 204.

In step S511, the dose ratio calculator 341 finds the standard dose "$D_{SD3}$" at the third divided field 525c to remove the test photosensitive film 16 from the flat surface of the test wafer 15 as shown in FIG. 7. The dose ratio calculator 341 extracts the standard dose "$D_{SD3}$" for the third divided field 525c from the plurality of exposure conditions 106M-106R, shown in FIG. 44. Then, the dose ratio calculator 341, shown in FIG. 1, finds the reference dose "$D_{RD3}$" at the third divided field 525c to remove the test photosensitive film 16 from one of plurality of the grid patterns 25m-25r. The dose ratio calculator 341 extracts the reference dose "$D_{RD3}$" at the third divided field 525c from the plurality of exposure conditions 106M-106R, shown in FIG. 44. Thereafter, the dose ratio calculator 341, shown in FIG. 1, calculates the dose ratio "$R_{ED3}$" at the third divided field 525c by dividing the reference dose "$D_{RD3}$" at the third divided field 525c by the standard dose "$D_{SD3}$" at the third divided field 525c. The dose ratio calculator 341 stores the calculated dose ratio "$R_{ED3}$" for the third divided field 525c in the dose ratio memory module 204.

In step S512, the dose ratio calculator 341 finds the standard dose "$D_{SD4}$" at the fourth divided field 525d to remove the test photosensitive film 16 from the flat surface of the test wafer 15, as shown in FIG. 7. The dose ratio calculator 341 extracts the standard dose "$D_{SD4}$" at the fourth divided field 525d from the exposure plurality of conditions 106S-106X, shown in FIG. 44. Then, the dose ratio calculator 341, shown in FIG. 1, finds the reference dose "$D_{RD4}$" at the fourth divided field 525d to remove the test photosensitive film 16 from one of the plurality of grid patterns 25s-25x. The dose ratio calculator 341 extracts the reference dose "$D_{RD4}$" at the fourth divided field 525d from the plurality of exposure conditions 106S-106X, shown in FIG. 44. Thereafter, the dose ratio calculator 341, shown in FIG. 1, calculates the dose ratio "$R_{ED4}$" at the fourth divided field 525d by dividing the reference dose "$D_{RD4}$" at the fourth divided field 525d by the standard dose "$D_{SD4}$" at the fourth divided field 525d. The dose ratio calculator 341 stores the calculated dose ratio "$R_{ED4}$" for the fourth divided field 525d in the dose ratio memory module 204.

In step S513, the evaluator 342 fetches the first to fourth dose ratios "$R_{ED1}$"-"$R_{ED4}$" for the first to fourth divided fields 525a-525d from the dose ratio memory module 204. The evaluator 342 compares the first to fourth dose ratios "$R_{ED1}$"-"$R_{ED4}$" for the first to fourth divided fields 525a-525d. When the dispersion of the first to fourth dose ratios "$R_{ED1}$"-"$R_{ED4}$" for the first to fourth divided fields 525a-525d is above the tolerance stored in the test condition, memory module 205, the evaluator 342 determines that the polarization state of the polarized light is not even on the surface of the test wafer 15.

As described above, the method for testing the polarization state according to the fifth embodiment makes it possible to determine whether the degree of polarization of the polarized light is even on the first to fourth divided field 525a-525d. When the degree of polarization of the polarized light is not even on the exposure field of the test wafer 15, the plurality of semiconductor devices manufactured by the exposure tool 3 have different sizes, depending on the position of the exposure field. Therefore, when the method for testing the polarization state according to the fifth embodiment reveals that the degree of polarization of the polarized light is not even on the exposure field, it is possible to adjust the degree of polarization of the polarized light emitted from the illumination optical system 14. Consequently, the method for testing the polarization state according to the fifth embodiment makes it possible to increase the preciseness of the semiconductor devices manufactured by the exposure tool 3.

OTHER EMBODIMENTS

Although the invention has been described above by reference to the embodiments of the present invention, the present invention is not limited to the embodiments described above. Modifications and variations of the embodiments described above will occur to those skilled in the art, in the light of the above teachings.

For example, a positive photoresist is used for the test photosensitive film 16, as shown in FIG. 5 and FIG. 18. However, a negative photoresist, a photosensitive film that changes a color, depending on the optical intensity of the light, such as a photochromic film, and a photosensitive film that changes the film thickness, depending on the optical intensity of the light, can be used for the test photosensitive film 16. Also, the method for testing the polarization state is applied to an exposure tool configured to manufacture the semiconductor device in the embodiments. However, it is possible to apply the system and the method for testing the polarization state to an exposure tool configured to manufacture a hologram, and a polarization microscope, for example. Therefore, it is possible to apply the system and the method according to the embodiments to various optical devices using the polarized light.

In FIG. 6, when the angle θ is 0 degrees, the reflectance is the highest. As the angle θ goes to 90 degrees, the reflectance decreases. However, such phenomenon depends on the depth of the groove in the grid pattern, the period, a ratio of the width of the groove to an interval between the grooves, and the material of the test photosensitive film 16. Therefore, an opposite phenomenon may be observed depending on the structure of the grid pattern. In such case, when the angle θ is 0 degrees, the reflectance is the lowest. As the angle θ goes to 90 degrees, the reflectance increases. Therefore, when the dose ratio "$R_E$" decreases in step S109 of FIG. 13, the evaluator 342 determines that the degree of polarization decreases.

As described above, the present invention includes many variations of the embodiments. Therefore, the scope of the invention is defined with reference to the following claims.

What is claimed is:

1. A method for testing a polarization state of polarized light comprising:
   preparing a test wafer, the test wafer having a flat surface and a grid pattern in which reflectance changes depending on a polarization direction of the polarized light;
   coating a test photosensitive film on the flat surface and the grid pattern of the test wafer, the test photosensitive film having a different optical property from the grid pattern;
   exposing the test photosensitive film to the polarized light;
   measuring a change in a property of the test photosensitive film on the flat surface and the grid pattern caused by the polarized light; and
   determining a polarization state of the polarized light, based on the change.

2. The method of claim 1, further comprising:
   obtaining a standard dose of the polarized light to change the test photosensitive film on the flat surface.

3. The method of claim 2, further comprising:
   obtaining a reference dose of the polarized light to change the test photosensitive film on the grid pattern to the same degree as on the flat surface.

4. The method of claim 3, further comprising:
   calculating a dose ratio of the reference dose to the standard dose.

5. The method of claim 3, further comprising:
   adjusting a direction of the grid pattern to be parallel to the polarization direction.

6. The method of claim 5, further comprising:
   determining that a degree of polarization of the polarized light deteriorates when the reference dose is increased.

7. The method of claim 3, further comprising:
   adjusting a direction of the grid pattern to be perpendicular to the polarization direction.

8. The method of claim 7, further comprising:
   determining that a degree of polarization of the polarized light increases when the reference dose is decreased.

9. The method of claim 1, wherein a pitch of the grid pattern is less than twice the wavelength of the polarized light.

10. The method of claim 1, wherein the grid pattern includes a plurality of electric conductors and a plurality of dielectric substances arranged periodically.

11. The method of claim 3, further comprising: determining a direction of the grid pattern to minimize the reference dose.

12. The method of claim 11, further comprising:
    determining that the polarization direction is parallel to the direction of the grid pattern.

13. The method of claim 1, wherein the polarized light is emitted from a multipole illumination.

14. The method of claim 13, wherein the polarized light passes through a pinhole disposed at a non-conjugate point of the test photosensitive film.

15. A method for manufacturing a semiconductor device comprising:
    preparing a test wafer, the test wafer having a flat surface and a grid pattern in which reflectance changes depending on a polarization direction of a polarized light;
    coating a test photosensitive film on the flat surface and the grid pattern of the test wafer, the test photosensitive film having a different optical property from the grid pattern;
    exposing the test photosensitive film to the polarized light;
    measuring a change in a property of the test photosensitive film on the flat surface and the grid pattern caused by the polarized light;
    determining a polarization state of the polarized light, based on the change;
    correcting an illumination optical system for the polarized light, based on the polarization state;
    coating a product resist film on a product wafer;
    projecting a circuit pattern onto the product resist film by using the corrected illumination optical system; and
    developing the product resist film to form a product resist pattern corresponding to the circuit pattern on the product wafer.

16. A test substrate for testing a polarization state of polarized light comprising:
    a test wafer having a grid pattern to be exposed to the polarized light, the grid pattern having a pitch less than twice the wavelength of the polarized light; and
    a test photosensitive film disposed on the grid pattern of the test wafer, the test photosensitive film having a different optical property from the grid pattern.

17. The test substrate of claim 16, wherein the grid pattern includes a plurality of electric conductors and a plurality of dielectric substances arranged periodically.

18. The test substrate of claim 17, wherein each of the plurality of electric conductors is composed of copper.

19. The test substrate of claim 17, wherein each of the plurality of dielectric substances is composed of silicon dioxide.

20. The method of claim 4, wherein the polarization state of the polarized light is determined by using the dose ratio.

21. The method of claim 15, further comprising:
    obtaining a standard dose of the polarized light to change the test photosensitive film on the flat surface;
    obtaining a reference dose of the polarized light to change the test photosensitive film on the grid pattern to the same degree as on the flat surface; and
    calculating a dose ratio of the reference dose to the standard dose;
    wherein the polarization state of the polarized light is determined by using the dose ratio.

* * * * *